United States Patent
Saotome et al.

(10) Patent No.: US 10,403,234 B2
(45) Date of Patent: *Sep. 3, 2019

(54) FIELD-EFFECT TRANSISTOR, DISPLAY ELEMENT, IMAGE DISPLAY DEVICE, AND SYSTEM

(71) Applicant: RICOH COMPANY, LTD., Tokyo (JP)

(72) Inventors: Ryoichi Saotome, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/987,144

(22) Filed: May 23, 2018

(65) Prior Publication Data

US 2018/0277060 A1    Sep. 27, 2018

Related U.S. Application Data

(63) Continuation of application No. 15/452,886, filed on Mar. 8, 2017, now Pat. No. 10,008,181.

(30) Foreign Application Priority Data

Mar. 11, 2016   (JP) ................................. 2016-048925

(51) Int. Cl.
*G09G 5/10* (2006.01)
*H01L 27/12* (2006.01)
(Continued)

(52) U.S. Cl.
CPC ............. *G09G 5/10* (2013.01); *H01L 27/124* (2013.01); *H01L 27/1225* (2013.01);
(Continued)

(58) Field of Classification Search
CPC .............. H01L 27/124; H01L 27/1225; H01L 27/3276; G09G 2300/0426
See application file for complete search history.

(56) References Cited

U.S. PATENT DOCUMENTS 9,112,039 B2   8/2015 Ueda et al.
9,418,842 B2   8/2016 Nakamura et al.
(Continued)

FOREIGN PATENT DOCUMENTS

JP   2010-135462   6/2010
JP   4623179   11/2010
(Continued)

OTHER PUBLICATIONS

K. Nomura, and 5 others "Room-temperature fabrication of transparent flexible thin film transistors using amorphous oxide semiconductors", NATURE, vol. 432, Nov. 25, 2004, pp. 488 to 492.
(Continued)

*Primary Examiner* — Liliana Cerullo
(74) *Attorney, Agent, or Firm* — Oblon, McClelland, Maier & Neustadt, L.L.P.

(57) ABSTRACT

A field-effect transistor including: a substrate; a passivation layer; a gate insulating layer, formed between the substrate and passivation layer; a source electrode and a drain electrode, formed to be in contact with the gate insulating layer; a semiconductor layer, formed at least between the source electrode and drain electrode and being in contact with the gate insulating layer, source electrode, and drain electrode; and a gate electrode, in contact with the gate insulating layer and facing the semiconductor layer via the gate insulating layer, wherein the passivation layer is formed of a single layer containing a paraelectric amorphous oxide containing a Group A element, an alkaline earth metal and a Group B element, at least one selected from Ga, Sc, Y, and lanthanoid, (Continued)

and the gate insulating layer contains at least one selected from oxides of Si, nitrides of Si, and oxynitrides of Si.

16 Claims, 8 Drawing Sheets

(51) Int. Cl.
    *H01L 27/32*     (2006.01)
    *G09G 3/20*     (2006.01)

(52) U.S. Cl.
    CPC ...... *H01L 27/3258* (2013.01); *H01L 27/3262* (2013.01); *H01L 27/3276* (2013.01); *G09G 3/20* (2013.01); *G09G 2300/0426* (2013.01); *G09G 2300/08* (2013.01); *G09G 2320/0646* (2013.01)

(56) References Cited

U.S. PATENT DOCUMENTS

| | | | |
|---|---|---|---|
| 10,008,181 B2* | 6/2018 | Saotome | H01L 27/3258 |
| 2010/0065844 A1 | 3/2010 | Tokunaga | |
| 2010/0133525 A1 | 6/2010 | Arai et al. | |
| 2013/0240871 A1 | 9/2013 | Shimoda et al. | |
| 2014/0009514 A1 | 1/2014 | Abe et al. | |
| 2014/0353648 A1 | 12/2014 | Abe et al. | |
| 2015/0028334 A1 | 1/2015 | Matsumoto et al. | |
| 2015/0055073 A1 | 2/2015 | Kim et al. | |
| 2015/0158300 A1 | 6/2015 | Ueda et al. | |
| 2015/0255744 A1* | 9/2015 | Kim | H01L 51/5218 257/40 |
| 2015/0349138 A1 | 12/2015 | Sone et al. | |
| 2016/0013215 A1 | 1/2016 | Ueda et al. | |
| 2016/0042947 A1 | 2/2016 | Nakamura et al. | |
| 2016/0190329 A1 | 6/2016 | Matsumoto et al. | |
| 2016/0267873 A1 | 9/2016 | Saotome et al. | |

FOREIGN PATENT DOCUMENTS

| | | |
|---|---|---|
| JP | 2014-022549 | 2/2014 |
| JP | 2015-111653 | 6/2015 |

OTHER PUBLICATIONS

Y. Ohta, 11 others, "Amorphous In—Ga—Zn—O TFT-LCDs with high reliability", IDW'09, 2009, pp. 1685-1688.

* cited by examiner

Light

Light

FIELD-EFFECT TRANSISTOR, DISPLAY ELEMENT, IMAGE DISPLAY DEVICE, AND SYSTEM

CROSS-REFERENCE TO RELATED APPLICATIONS

The present application is a Rule 1.53(b) Continuation of U.S. application Ser. No. 15/452,886, filed Mar. 8, 2017 which claims priority under 35 U.S.C. § 119 to Japanese Patent Application No. 2016-048925, filed Mar. 11, 2016. The contents of which are incorporated herein by reference in their entirety.

BACKGROUND OF THE INVENTION

Field of the Invention

The present disclosure relates to a field-effect transistor, a display element, an image display device, and a system.

Description of the Related Art

Field-effect transistors (FETs) are transistors which control electric current between a source electrode and a drain electrode based on the principle that an electric field is applied to a gate electrode to provide a gate in a flow of electrons or holes utilizing an electric field of a channel.

By virtue of their characteristics, the FETs have been used as, for example, switching elements and amplifying elements. The FETs are low in gate current and have a flat structure, and thus can be easily produced and integrated as compared with bipolar transistors. For these reasons, the FETs are essential elements in integrated circuits used in the existing electronic devices. The FETs have been applied to, for example, active matrix displays as thin film transistor (TFTs).

In recent years, flat panel displays (FPDs), liquid crystal displays (LCDs), organic electroluminescent (EL) displays, and electronic paper have been put into practice.

These FPDs are driven by a driving circuit containing TFTs using amorphous silicon or polycrystalline silicon in an active layer. The FPDs have been required to have an increased size, improved definition and image quality, and an increased driving speed. To this end, there is a need for TFTs that have high carrier mobility, a high on/off ratio, small changes in properties over time, and small variation between the elements.

However, amorphous silicon or polycrystalline silicon have advantages and disadvantages. It was therefore difficult to satisfy all of the above requirements at the same time. In order to respond to these requirements, developments have been actively conducted on TFTs using, in an active layer, an oxide semiconductor the mobility of which can be expected to be higher than amorphous silicon. For example, disclosed is a TFT using $InGaZnO_4$ in a semiconductor layer (for example, K. Nomura, and 5 others "Room-temperature fabrication of transparent flexible thin film transistors using amorphous oxide semiconductors", *NATURE*, VOL. 432, 25 Nov. 2004, pp. 488 to 492 (hereinafter may be referred to as Non-Patent Literature 1)).

The TFT is required to have a small change in threshold voltage. One reason why the threshold voltage of the TFT will change is that moisture, oxygen, hydrogen, and other substances in the atmosphere are adsorbed onto or released from the semiconductor layer. Also, the threshold voltage will change as a result of repeating ON and OFF of the TFT many times for a long time. As a method for evaluating a change in threshold voltage as a result of such ON and OFF operations repeated many times for a long time, a bias temperature stress (BTS) test is generally performed. This test is a method of evaluating a change in threshold voltage when constant voltage is continuously applied between a gate electrode and a source electrode of a field-effect transistor, or a method of evaluating a change in threshold voltage when constant voltage is continuously applied between a gate electrode and a source electrode and between a drain electrode and a source electrode.

In order to suppress a change in threshold voltage of the TFT, the TFT generally has a passivation layer. Here, the passivation layer refers to a layer having functions such as separation and protection of semiconductors from moisture, oxygen, hydrogen, and other substances in the atmosphere. Also, the passivation layer may be called a protection layer.

As an approach regarding a protection layer (passivation layer) for suppressing a change in threshold voltage of the TFT, disclosed is a field-effect transistor containing a protection layer (passivation layer) having a laminated structure, one layer of which is $SiO_2$, $Si_3N_4$, SiON, $Al_2O_3$, $Ta_2O_5$, $TiO_2$, $HfO_2$, $ZrO_2$, or $Y_2O_3$ (for example, Japanese Unexamined Patent Application Publication No. 2010-135462 (hereinafter may be referred to as Patent Literature 1)). Also, a field-effect transistor containing a passivation layer of $SiO_2$ is disclosed (for example, Y. Ohta, 11 others, "Amorphous In—Ga—Zn—O TFT-LCDs with high reliability", IDW09, 2009, pp. 1685-1688 (hereinafter may be referred to as Non-Patent Literature 2)). Further, disclosed is a field-effect transistor containing a protection layer (passivation layer) having a laminated structure of a first protection layer (passivation layer) containing a first complex metal oxide containing Si and an alkaline earth metal; and a second protection layer (passivation layer) containing a second complex metal oxide containing an alkaline earth metal and a rare earth element (for example, Japanese Unexamined Patent Application Publication No. 2015-111653 (hereinafter may be referred to as Patent Literature 2)).

SUMMARY OF THE INVENTION

According to one aspect of the present disclosure, a field-effect transistor includes a substrate, a passivation layer, a gate insulating layer, which is formed between the substrate and the passivation layer, a source electrode and a drain electrode, which are formed to be in contact with the gate insulating layer, a semiconductor layer, which is formed at least between the source electrode and the drain electrode and is in contact with the gate insulating layer, the source electrode, and the drain electrode, and a gate electrode, which is in contact with the gate insulating layer and faces the semiconductor layer via the gate insulating layer. The passivation layer is formed of a single layer containing a paraelectric amorphous oxide containing a Group A element which is an alkaline earth metal and a Group B element which is at least one selected from the group consisting of Ga, Sc, Y, and lanthanoid. The gate insulating layer contains at least one selected from the group consisting of oxides of Si, nitrides of Si, and oxynitrides of Si.

DESCRIPTION OF THE EMBODIMENTS

Figure 1:
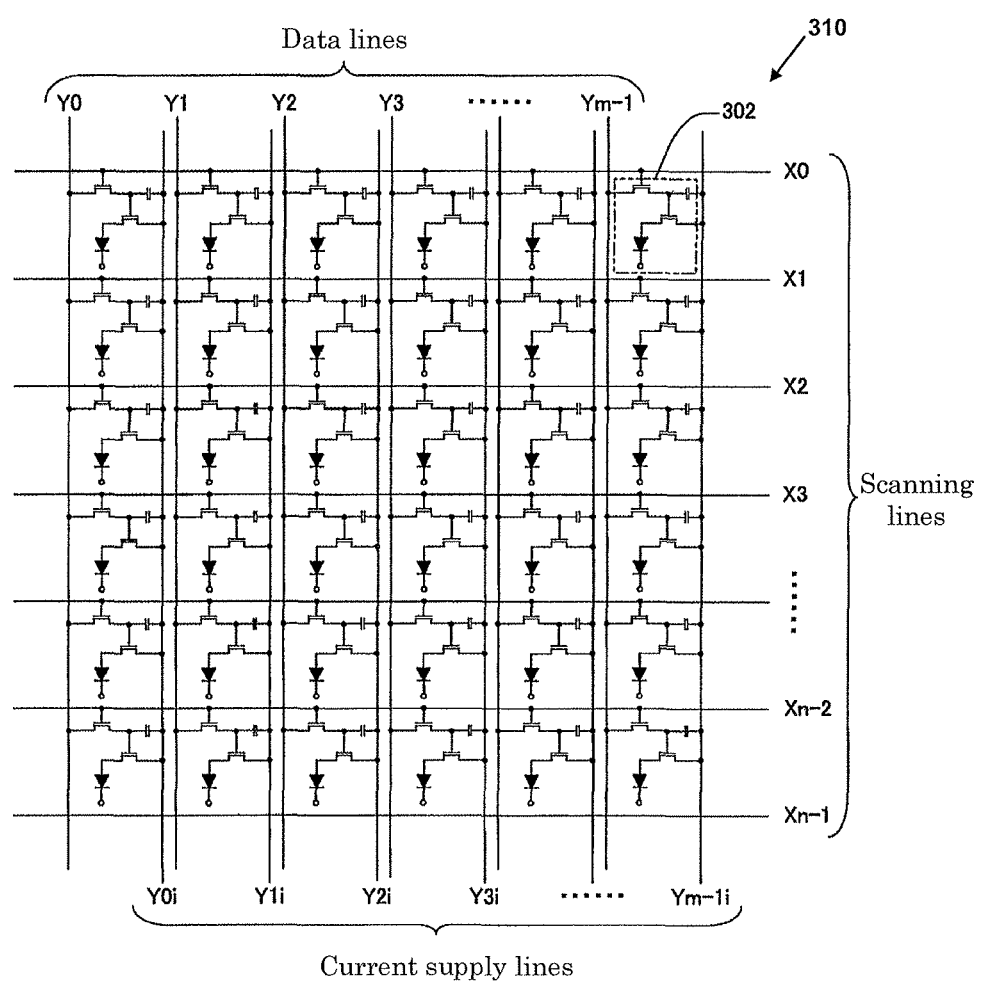
FIG. 1 is a diagram for explaining an image display device.

The present disclosure has an object to provide a field-effect transistor including a passivation layer formed of a single layer, the field-effect transistor exhibiting a small change in threshold voltage in the BTS test.

The present disclosure can provide a field-effect transistor including a passivation layer formed of a single layer, the field-effect transistor exhibiting a small change in threshold voltage in the BTS test.

(Field-Effect Transistor)

A field-effect transistor of the present disclosure includes a substrate, a passivation layer, a gate insulating layer, a source electrode, a drain electrode, a semiconductor layer, and a gate electrode; and if necessary, further includes other members.

The passivation layer is formed of a single layer containing a paraelectric amorphous oxide containing a Group A element which is an alkaline earth metal and a Group B element which is at least one selected from the group consisting of Ga, Sc, Y, and lanthanoid.

The gate insulating layer contains at least one selected from the group consisting of oxides of Si, nitrides of Si, and oxynitrides of Si.

It is reported that the field-effect transistor containing the protection layer (passivation layer) described in the above Patent Literature 1 can suppress release of oxygen from the oxide semiconductor layer and improve reliability. However, any data regarding the BTS test are not disclosed, and thus it cannot be said that sufficient reliability mentioned in the present disclosure can be ensured.

The field-effect transistor containing the passivation layer described in the above Non-Patent Literature 2 is evaluated for reliability in the BTS test. However, a change in threshold voltage (ΔVth) is larger as the test time passes, and thus it cannot be said that sufficient reliability mentioned in the present disclosure can be ensured.

In the field-effect transistors of the above Patent Literature 1 and the above Patent Literature 2, the protection layer (passivation layer) has a laminated structure. In terms of, for example, simplifying the production process and cost, it is preferable to produce a field-effect transistor containing a protection layer of a single layer rather than a complicated layer structure.

The above Patent Literature 2 describes Comparative Examples where the protection layer (passivation layer) is a single layer, in comparison to Examples where the protection layer (passivation layer) has a laminated structure. However, for example, the field-effect transistor described in Comparative Example 6, containing a gate insulating layer of $Al_2O_3$ and a protection layer (passivation layer) formed of a single layer containing a rare earth element and an alkaline earth metal, has a large change in threshold voltage in the BTS test and indicates that sufficient reliability cannot be ensured (the experiment corresponding to Comparative Example 6 of this Patent Literature 2 is conducted as a comparative experiment in the present disclosure, and results of this experiment are presented in Comparative Example 1 below).

The present inventors conducted extensive studies and have found that even in a field-effect transistor containing a passivation layer of a single layer, by specifying the kinds of the passivation layer and a gate insulating layer and combining the specific passivation layer and the specific gate insulating layer, a field-effect transistor having a small change in threshold voltage in the BTS test can be obtained.

The field-effect transistor of the present disclosure having the above configuration, where the passivation layer is a single layer, is a field-effect transistor having a small change in threshold voltage in the BTS test and exhibiting high reliability.

A shape, a structure, and a size of the substrate are not particularly limited and may be appropriately selected depending on the intended purpose.

A material of the substrate is not particularly limited and may be appropriately selected depending on the intended purpose. Examples of the material include glass and plastics.

The glass is not particularly limited and may be appropriately selected depending on the intended purpose. Examples of the glass include alkali-free glass and silica glass.

The plastics are not particularly limited and may be appropriately selected depending on the intended purpose. Examples of the plastics include polycarbonate (PC), polyimide (PI), polyethylene terephthalate (PET), and polyethylene naphthalate (PEN).

Note that, pre-treatments, such as oxygen plasma, UV ozone, and UV radiation washing, are preferably performed on the substrate to clean a surface of the substrate and improve adhesiveness.

<Passivation Layer>

The passivation layer in the present disclosure a layer having functions such as separation and protection of semiconductors from moisture, oxygen, hydrogen, and other substances in the atmosphere. Also, the passivation layer may be called a protection layer.

The passivation layer is generally formed above the substrate.

The passivation layer contains a paraelectric amorphous oxide.

The passivation layer is preferably formed of the paraelectric amorphous oxide itself.

The passivation layer is formed of a single layer. Here, the single layer means a layer formed of the same kind of component and is intended to exclude a laminated structure where two or more layers formed of different kinds of component are laminated.

—Paraelectric Amorphous Oxide—

The paraelectric amorphous oxide contains a Group A element which is an alkaline earth metal and a Group B element which is at least one selected from the group consisting of Ga (gallium), Sc (scandium), Y (yttrium), and lanthanoid. The paraelectric amorphous oxide preferably contains a Group C element which is at least one of Al (aluminium), Ti (titanium), Zr (zirconium), Hf (hafnium), Nb (niobium), and Ta (tantalum). The paraelectric amorphous oxide further contains other component according to the necessity.

In terms of improvement in reliability of transistors, it is a preferable embodiment that the passivation layer is formed of an amorphous material. This is because when the passivation layer is formed of a crystalline material, moisture, oxygen, and hydrogen in the atmosphere are adsorbed onto or released from the semiconductor layer through, for example, grain boundaries, leading to deterioration in reliability of transistors.

Also, it is necessary for the passivation layer to be a paraelectric in terms of reducing hysteresis in transfer characteristics of transistors. Although such a special case that transistors are used for memories and other applications is exceptional, in general, the existence of hysteresis is not preferable in devices utilizing switching characteristics of transistors.

The paraelectric is a dielectric other than a piezoelectric, a pyroelectric, and a ferroelectric. In other words, the paraelectric refers to a dielectric that neither generates polarization by pressure nor has spontaneous polarization in the absence of an external electric field. Also, the piezoelectric, the pyroelectric, and the ferroelectric are needed to be crystals for developing their characteristics. That is, when a passivation layer is formed of an amorphous material, this passivation layer naturally becomes a paraelectric.

The paraelectric amorphous oxide is stable in the atmosphere and can stably form an amorphous structure in a wide range of compositions. This results from the finding obtained by the present inventors that oxides containing a Group A element which is an alkaline earth metal and a Group B element which is at least one selected from the group consisting of Ga, Sc, Y, and lanthanoid are stable in the atmosphere and can stably form an amorphous structure in a wide range of compositions.

Typically, simple oxides of alkaline earth metals tend to react with moisture or carbon dioxide in the atmosphere to easily form hydroxides or carbonates and therefore such simple oxides alone are not suitable for use in electronic devices. Moreover, simple oxides of Ga, Sc, Y, and lanthanoid tend to be crystallized and problematically cause leakage current when attempted to be used in electronic devices. However, the present inventors have found that the paraelectric amorphous oxide containing a Group A element which is an alkaline earth metal and a Group B element which is at least one selected from the group consisting of Ga, Sc, Y, and lanthanoid stably forms an amorphous film in a wide range of compositions. Because the paraelectric amorphous oxide is stably present in a wide range of compositions, a dielectric constant and a linear expansion coefficient of the paraelectric amorphous oxide to be formed can be variably controlled depending on the compositional ratio.

In the present disclosure, the present inventors have found that the passivation layer containing the paraelectric amorphous oxide exhibits excellent barrier properties against moisture, oxygen, and hydrogen in the atmosphere.

Therefore, it is possible to provide a field-effect transistor exhibiting high reliability by using the passivation layer.

The paraelectric amorphous oxide preferably contains a Group C element which is at least one selected from the group consisting of Al, Ti, Zr, Hf, Nb, and Ta. When the paraelectric amorphous oxide contains at least one selected from the group consisting of Al, Ti, Zr, Hf, Nb, and Ta, thermal stability, heat resistance, and denseness can be further improved.

Examples of the Group A element which is an alkaline earth metal in the paraelectric amorphous oxide include Be (beryllium), Mg (magnesium), Ca (calcium), Sr (strontium), and Ba (barium). These alkaline earth metals may be used alone or in combination.

Examples of the Group B element which is at least one selected from the group consisting of Ga, Sc, Y, and lanthanoid in the paraelectric amorphous oxide include Ga (gallium), Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

An atomic ratio (NA:NB) between a total number of atoms of the Group A element (NA) and a total number of atoms of the Group B element (NB) in the paraelectric amorphous oxide is not particularly limited and may be appropriately selected depending on the intended purpose, but preferably satisfies the following range.

NA:NB=(from 3 through 50) at %:(from 50 through 97) at %

Here, NA+NB=100 at %

An atomic ratio (NA:NB:NC) among the total number of atoms of the Group A element (NA), the total number of atoms of the Group B element (NB), and a total number of atoms of the Group C element (NC) in the paraelectric amorphous oxide is not particularly limited and may be appropriately selected depending on the intended purpose, but preferably satisfies the following range.

NA:NB:NC=(from 3 through 47) at % (from 50 through 94) at %:(from 3 through 47) at %

Here, NA+NB+NC=100 at %

The ratios of the Group A element, the Group B element, and the Group C element in the paraelectric amorphous oxide can be calculated, for example, by analyzing a cationic element of the oxide through X-ray fluorescence spectrometry, electron probe microanalysis (EPMA), or inductively coupled plasma atomic emission spectroscopy (ICP-AES).

A dielectric constant of the passivation layer is not particularly limited and may be appropriately selected depending on the intended purpose.

The dielectric constant can be measured, for example, by producing a capacitor, in which a lower electrode, a dielectric layer (the passivation layer), and an upper electrode are laminated, and measuring the produced capacitor using an LCR meter.

A linear expansion coefficient of the passivation layer is not particularly limited and may be appropriately selected depending on the intended purpose.

The linear expansion coefficient can be measured, for example, by using a thermomechanical analysis device. In this measurement, the linear expansion coefficient can be measured by separately producing a measurement sample having the same composition as the passivation layer, without producing the field-effect transistor.

—Formation Method of Passivation Layer—

A formation method of the passivation layer is not particularly limited and may be appropriately selected depending on the intended purpose. Examples of the formation method include a method of forming a film by a vacuum process, such as sputtering, pulsed laser deposition (PLD), chemical vapor deposition (CVD), or atomic layer deposition (ALD) and patterning the film through photolithography.

Moreover, the passivation layer can be formed by preparing a coating liquid containing a precursor of the paraelectric amorphous oxide (a passivation-layer-coating liquid), coating or printing the coating liquid onto an object to be coated, and baking the resultant under appropriate conditions.

An average film thickness of the passivation layer is preferably from 10 nm through 1,000 nm, more preferably from 20 nm through 500 nm.

—Passivation-Layer-Coating Liquid—The passivation-layer-coating liquid contains an alkaline-earth-metal-containing compound (Group-A-element-containing compound), a Group-B-element-containing compound, and a solvent, preferably contains at least one Group-C-element-containing compound, and further contains other component according to the necessity.

—Alkaline-Earth-Metal-Containing Compound (Group-A-Element-Containing Compound)—

Examples of the alkaline-earth-metal-containing compound include inorganic alkaline earth metal compounds and organic alkaline earth metal compounds. Examples of alkaline earth metals in the alkaline-earth-metal-containing compound include Be (beryllium), Mg (magnesium), Ca (calcium), Sr (strontium), and Ba (barium).

Examples of the inorganic alkaline earth metal compounds include alkaline earth metal nitrate, alkaline earth metal sulfate, alkaline earth metal chlorides, alkaline earth metal fluorides, alkaline earth metal bromides, and alkaline earth metal iodides.

Examples of the alkaline earth metal nitrate include magnesium nitrate, calcium nitrate, strontium nitrate, and barium nitrate.

Examples of the alkaline earth metal sulfate include magnesium sulfate, calcium sulfate, strontium sulfate, and barium sulfate.

Examples of the alkaline earth metal chlorides include magnesium chloride, calcium chloride, strontium chloride, and barium chloride.

Examples of the alkaline earth metal fluorides include magnesium fluoride, calcium fluoride, strontium fluoride, and barium fluoride.

Examples of the alkaline earth metal bromides include magnesium bromide, calcium bromide, strontium bromide, and barium bromide.

Examples of the alkaline earth metal iodides include magnesium iodide, calcium iodide, strontium iodide, and barium iodide.

The organic alkaline earth metal compounds are not particularly limited and may be appropriately selected depending on the intended purpose, so long as the organic alkaline earth metal compounds are each a compound containing an alkaline earth metal and an organic group. The alkaline earth metal and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, phenyl groups which may have substituents, acetyl acetonate groups which may have substituents, and sulfonic acid groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include: acyloxy groups containing from 1 through 10 carbon atoms; acyloxy groups part of which is substituted with a benzene ring, such as benzoic acid; acyloxy groups part of which is substituted with a hydroxyl group, such as lactic acid; and acyloxy groups containing two or more carbonyl groups, such as oxalic acid and citric acid.

Examples of the organic alkaline earth metal compound include magnesium methoxide, magnesium ethoxide, diethyl magnesium, magnesium acetate, magnesium formate, acetylacetone magnesium, magnesium 2-ethylhexanoate, magnesium lactate, magnesium naphthenate, magnesium citrate, magnesium salicylate, magnesium benzoate, magnesium oxalate, magnesium trifluromethanesulfonate, calcium methoxide, calcium ethoxide, calcium acetate, calcium formate, acetylacetone calcium, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, acetylacetone strontium, strontium 2-ethylhexanoate, strontium lactate, strontium naphthenate, strontium salicylate, strontium oxalate, barium ethoxide, barium isopropoxide, barium acetate, barium formate, acetylacetone barium, barium 2-ethylhexanoate, barium lactate, barium naphthenate, barium neodecanoate, barium oxalate, barium benzoate, barium trifluoromethane-sulfonate, and bis(acetylacetonato) beryllium.

An amount of the alkaline-earth-metal-containing compound in the passivation-layer-coating liquid is not particularly limited and may be appropriately selected depending on the intended purpose.

Group-B-Element-Containing Compound—

Examples of the Group B elements in the Group-B-element-containing compound include Ga (gallium), Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

Examples of the Group-B-element-containing compound include inorganic Group-B-element-containing compounds and organic Group-B-element-containing compounds.

Examples of the inorganic Group-B-element-containing compounds include nitrates of the Group B elements, sulfates of the Group B elements, fluorides of the Group B elements, chlorides of the Group B elements, bromides of the Group B elements, and iodides of the Group B elements.

Examples of the nitrates of the Group B elements include gallium nitrate, scandium nitrate, yttrium nitrate, lanthanum nitrate, cerium nitrate, praseodymium nitrate, neodymium nitrate, samarium nitrate, europium nitrate, gadolinium nitrate, terbium nitrate, dysprosium nitrate, holmium nitrate, erbium nitrate, thulium nitrate, ytterbium nitrate, and lutetium nitrate.

Examples of the sulfates of the Group B elements include gallium sulfate, scandium sulfate, yttrium sulfate, lanthanum sulfate, cerium sulfate, praseodymium sulfate, neodymium sulfate, samarium sulfate, europium sulfate, gadolinium sulfate, terbium sulfate, dysprosium sulfate, holmium sulfate, erbium sulfate, thulium sulfate, ytterbium sulfate, and lutetium sulfate.

Examples of the fluorides of the Group B elements include gallium fluoride, scandium fluoride, yttrium fluoride, lanthanum fluoride, cerium fluoride, praseodymium fluoride, neodymium fluoride, samarium fluoride, europium fluoride, gadolinium fluoride, terbium fluoride, dysprosium fluoride, holmium fluoride, erbium fluoride, thulium fluoride, ytterbium fluoride, and lutetium fluoride.

Examples of the chlorides of the Group B elements include gallium chloride, scandium chloride, yttrium chloride, lanthanum chloride, cerium chloride, praseodymium chloride, neodymium chloride, samarium chloride, europium chloride, gadolinium chloride, terbium chloride, dysprosium chloride, holmium chloride, erbium chloride, thulium chloride, ytterbium chloride, and lutetium chloride.

Examples of the bromides of the Group B elements include gallium bromide, scandium bromide, yttrium bromide, lanthanum bromide, praseodymium bromide, neodymium bromide, samarium bromide, europium bromide, gadolinium bromide, terbium bromide, dysprosium bromide, holmium bromide, erbium bromide, thulium bromide, ytterbium bromide, and lutetium bromide.

Examples of the iodides of the Group B elements include gallium iodide, scandium iodide, yttrium iodide, lanthanum iodide, cerium iodide, praseodymium iodide, neodymium iodide, samarium iodide, europium iodide, gadolinium iodide, terbium iodide, dysprosium iodide, holmium iodide, erbium iodide, thulium iodide, ytterbium iodide, and lutetium iodide.

The organic Group-B-element-containing compound is not particularly limited and may be appropriately selected depending on the intended purpose, so long as the organic Group-B-element-containing is a compound containing a Group B element and an organic group. The Group B element and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the organic Group-B-element-containing compound include tris(cyclopentadienyl)gallium, scandium isopropoxide, scandium acetate, tris(cyclopentadienyl)scandium, yttrium isopropoxide, yttrium 2-ethylhexanoate, tris(acetylacetonato)yttrium, tris(cyclopentadienyl)yttrium, lanthanum isopropoxide, lanthanum 2-ethylhexanoate, tris(acetylacetonato)lanthanum, tris(cyclopentadienyl)lanthanum, cerium 2-ethylhexanoate, tris(acetylacetonato)cerium, tris(cyclopentadienyl)cerium, praseodymium isopropoxide, praseodymium oxalate, tris(acetylacetonato)praseodymium, tris(cyclopentadienyl)praseodymium, neodymium isopropoxide, neodymium 2-ethylhexanoate, neodymium trifluoroacetylacetonate, tris(isopropylcyclopentadienyl) neodymium, tris(ethylcyclopentadienyl)promethium, samarium isopropoxide, samarium 2-ethylhexanoate, tris(acetylacetonato)samarium, tris(cyclopentadienyl)samarium, europium 2-ethylhexanoate, tris(acetylacetonato)europium, tris(ethylcyclopentadienyl)europium, gadolinium isopropoxide, gadolinium 2-ethylhexanoate, tris(acetylacetonato)gadolinium, tris(cyclopentadienyl)gadolinium, terbium acetate, tris(acetylacetonato)terbium, tris(cyclopentadienyl)terbium, dysprosium isopropoxide, dysprosium acetate, tris(acetylacetonato)dysprosium, tris(ethylcyclopentadienyl)dysprosium, holmium isopropoxide, holmium acetate, tris(cyclopentadienyl)holmium, erbium isopropoxide, erbium acetate, tris(acetylacetonato)erbium, tris(cyclopentadienyl)erbium, thulium acetate, tris(acetylacetonato)thulium, tris(cyclopentadienyl)thulium, ytterbium isopropoxide, ytterbium acetate, tris(acetylacetonato)ytterbium, tris(cyclopentadienyl)ytterbium, lutetium oxalate, and tris(ethylcyclopentadienyl)lutetium.

An amount of the Group-B-element-containing compound in the passivation-layer-coating liquid is not particularly limited and may be appropriately selected depending on the intended purpose.

—Group-C-Element-Containing Compound—

Examples of the Group C element include Al (aluminium), Ti (titanium), Zr (zirconium), Hf (hafnium), Nb (niobium), and Ta (tantalum).

Examples of the Group-C-element-containing compound include inorganic compounds of the Group C elements and organic compounds of the Group C elements.

Examples of the inorganic compounds of the Group C elements include aluminium nitrate, aluminium sulfate, aluminium fluoride, aluminium chloride, aluminium bromide, aluminium iodide, aluminium hydroxide, aluminium phosphate, ammonium aluminum sulfate, titanium sulfide, titanium fluoride, titanium chloride, titanium bromide, titanium iodide, zirconium sulfate, zirconium carbonate, zirconium fluoride, zirconium chloride, zirconium bromide, zirconium iodide, hafnium sulfate, hafnium fluoride, hafnium chloride, hafnium bromide, hafnium iodide, niobium fluoride, niobium chloride, niobium bromide, tantalum fluoride, tantalum chloride, and tantalum bromide.

The organic compounds of the Group C elements are not particularly limited and may be appropriately selected depending on the intended purpose, so long as the organic compounds of the Group C elements are each a compound containing a Group C element and an organic group. The Group C element and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the organic compounds of the Group C elements include aluminium isopropoxide, aluminium-sec-butoxide, triethylaluminium, diethylaluminium ethoxide, aluminium acetate, acetylacetone aluminium, aluminium hexafluoroacetylacetonate, aluminium 2-ethylhexanoate, aluminium lactate, aluminium benzoate, aluminium di(s-butoxide)acetoacetic acid ester chelate, aluminium trifluoromethanesulfonate, titanium isopropoxide, bis(cyclopentadienyl)titanium chloride, zirconium butoxide, zirconium isopropoxide, zirconium bis(2-ethylhexanoate)oxide, zirconium (n-butoxide)bisacetylacetonate, zirconium tetrakis (acetylacetonate), tetrakis(cyclopentadienyl)zirconium, hafnium butoxide, hafnium isopropoxide, hafnium tetrakis(2-ethylhexanoate), hafnium di(n-butoxide)bisacetylacetonate, hafnium tetrakis(acetylacetonate), bis(cyclopentadienyl)dimethylhafnium, niobium butoxide, niobium 2-ethylhexanoate, bis(cyclopentadienyl)niobium chloride, tantalum ethoxide, and tantalum tetraethoxyacetyiacetonate.

An amount of the Group-C-element-containing compound in the passivation-layer-coating liquid is not particularly limited and may be appropriately selected depending on the intended purpose.

—Solvent—

The solvent is not particularly limited and may be appropriately selected depending on the intended purpose, so long as the solvent is capable of stably dissolving or dispersing the above various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethyl hexanoate, mineral spirits, dimethylpropylene urea, 4-butyrolactone, 2-methoxy ethanol, propylene glycol, and water.

An amount of the solvent in the passivation-layer-coating liquid is not particularly limited and may be appropriately selected depending on the intended purpose.

An atomic ratio (NA:NB) between a total number of atoms of the Group A element (NA) and a total number of atoms of the Group B element (NB) in the passivation-layer-coating liquid is not particularly limited and may be appropriately selected depending on the intended purpose, but preferably satisfies the following range.

NA:NB=(from 3 through 50) at %:(from 50 through 97) at %

Here, NA+NB=100 at %

An atomic ratio (NA:NB:NC) among the total number of atoms of the Group A element (NA), the total number of atoms of the Group B element (NB), and a total number of atoms of the Group C element (NC) in the passivation-layer-coating liquid is not particularly limited and may be appropriately selected depending on the intended purpose, but preferably satisfies the following range.

NA:NB:NC=(from 3 through 47) at %:(from 50 through 94) at % (from 3 through 47) at %

Here, NA+NB+NC=100 at %

—Formation Method of Passivation Layer Using Passivation-Layer-Coating Liquid—

One example of a formation method of the passivation layer using the passivation-layer-coating liquid will be described. The formation method of the passivation layer contains a coating step and a heat treatment step and further contains other steps according to the necessity.

The coating step is not particularly limited and may be appropriately selected depending on the intended purpose, so long as the coating step is a step of coating the passivation-layer-coating liquid onto an object to be coated. A method of the coating is not particularly limited and may be appropriately selected depending on the intended purpose. Examples of the method include: a method of forming a film through a solution process and patterning the film through photolithography; and a method of directly forming a film having a desired shape by printing, such as inkjet printing, nanoimprinting, or gravure printing. Examples of the solution process include dip coating, spin coating, die coating, and nozzle printing.

The heat treatment step is not particularly limited and may be appropriately selected depending on the intended purpose, so long as the heat treatment step is a step of heat-treating the passivation-layer-coating liquid coated on the object to be coated. Note that, in the heat treatment step, the passivation-layer-coating liquid coated on the object to be coated may be dried through air drying. As a result of the heat treatment, the solvent is evaporated and the paraelectric amorphous oxide is generated.

In the heat treatment step, evaporation of the solvent (hereinafter referred to as "evaporation treatment") and generation of the paraelectric amorphous oxide (hereinafter referred to as "generation treatment") are preferably performed at different temperatures. Specifically, it is preferable that after the evaporation of the solvent, the temperature be elevated to generate the paraelectric amorphous oxide. At the time of generation of the paraelectric amorphous oxide, for example, at least one selected from the group consisting of the alkaline-earth-metal-containing compound (Group-A-element-containing compound), the Group-B-element-containing compound, and Group-C-element-containing compound is decomposed.

A temperature of the evaporation treatment is not particularly limited and may be appropriately selected depending on the solvent contained. For example, the temperature of the evaporation treatment is from 80° C. through 180° C. As for the evaporation, it is effective to use a vacuum oven for reducing the required temperature. A time of the evaporation treatment is not particularly limited and may be appropriately selected depending on the intended purpose. For example, the time of the evaporation treatment is from 1 minute through 1 hour.

A temperature of the generation treatment is not particularly limited and may be appropriately selected depending on the intended purpose. However, the temperature of the generation treatment is preferably 100° C. or higher but lower than 550° C., more preferably from 200° C. through 500° C. The time of the generation treatment is not particularly limited and may be appropriately selected depending on the intended purpose. For example, the time of the generation treatment is from 1 hour through 5 hours.

Note that, in the heat treatment step, the evaporation treatment and the generation treatment may be continuously performed or may be performed in a divided manner of a plurality of steps.

A method of the heat treatment is not particularly limited and may be appropriately selected depending on the intended purpose. Examples of the method of the heat treatment include a method of heating the object to be coated. An atmosphere in the heat treatment is not particularly limited and may be appropriately selected depending on the intended purpose. However, the atmosphere is preferably an oxygen atmosphere. When the heat treatment is performed in the oxygen atmosphere, decomposed products can be promptly discharged to the outside of the system and generation of the paraelectric amorphous oxide can be accelerated.

In the heat treatment, in view of acceleration of reaction of the generation treatment, it is effective to apply ultraviolet rays having a wavelength of 400 nm or shorter to the material after the evaporation treatment. Applying the ultraviolet rays having a wavelength of 400 nm or shorter can cleave chemical bonds of the organic material contained in the material after the evaporation treatment and can decompose the organic material. Therefore, the paraelectric amorphous oxide can be efficiently formed. The ultraviolet rays having a wavelength of 400 nm or shorter are not particularly limited and may be appropriately selected depending on the intended purpose. Examples of the ultraviolet rays include ultraviolet rays having a wavelength of 222 nm emitted from an excimer lamp. It is also preferable to apply ozone instead of or in combination with the ultraviolet rays. Applying the ozone to the material after the evaporation treatment accelerates generation of the oxide.

<Gate Insulating Layer>

The gate insulating layer is generally formed between the substrate and the passivation layer.

The gate insulating layer contains at least one selected from the group consisting of oxides of Si, nitrides of Si, and oxynitrides of Si.

—Formation Method of Gate Insulating Layer—

A formation method of the gate insulating layer is not particularly limited and may be appropriately selected depending on the intended purpose. Examples of the formation method include: vacuum film forming methods such as sputtering, chemical vapor deposition (CVD), and atomic layer deposition (ALD); and printing methods such as spin coating, die coating, and inkjetting.

An average film thickness of the gate insulating layer is not particularly limited and may be appropriately selected depending on the intended purpose. It is preferably from 50 nm through 3 µm, more preferably 100 nm through 1 µm.

In the present disclosure, the present inventors have found that by combining a gate insulating layer containing at least one selected from the group consisting of oxides of Si, nitrides of Si, and oxynitrides of Si, with a passivation layer containing a paraelectric amorphous oxide containing a Group A element which is an alkaline earth metal and a Group B element which is at least one selected from the group consisting of Ga, Sc, Y, and lanthanoid, even if the passivation layer has a single layer structure rather than a laminated structure, a field-effect transistor having a small change in threshold voltage in the BTS test can be obtained. Therefore, it is possible to provide a field-effect transistor exhibiting high reliability by combining the specific gate insulating layer defined in the present disclosure with the specific passivation layer defined in the present disclosure.

<Source Electrode and Drain Electrode>

The source electrode and the drain electrode are not particularly limited and may be appropriately selected depending on the intended purpose, so long as the source electrode and the drain electrode are electrodes configured to take electric current out from the field-effect transistor.

The source electrode and the drain electrode are formed to be in contact with the gate insulating layer.

A material of the source electrode and the drain electrode is not particularly limited and may be appropriately selected depending on the intended purpose. Examples of the material include: metals (e.g., Mo, Al, Au, Ag, and Cu) and alloys of these metals; transparent conductive oxides, such as indium tin oxide (ITO) and antimony-doped tin oxide (ATO); and organic conductors, such as polyethylene dioxythiophene (PEDOT) and polyaniline (PANT).

—Formation Method of Source Electrode and Drain Electrode—

A formation method of the source electrode and the drain electrode is not particularly limited and may be appropriately selected depending on the intended purpose. Examples of the formation method include: (i) a method of forming a film through sputtering or dip coating and patterning the film through photolithography; and (ii) a method of directly forming a film having a desired shape through a printing process, such as inkjet printing, nanoimprinting, or gravure printing.

An average film thickness of the source electrode and the drain electrode is not particularly limited and may be appropriately selected depending on the intended purpose. However, the average film thickness is preferably from 20 nm through 1 µm, more preferably from 50 nm through 300 nm.

<Semiconductor Layer>

The semiconductor layer is formed at least between the source electrode and the drain electrode.

Here, the "between" means a position at which the semiconductor layer allows the field-effect transistor to function together with the source electrode and the drain electrode. The position of the semiconductor layer is not particularly limited and may be appropriately selected depending on the intended purpose, so long as the position is the above-described position.

The semiconductor layer is in contact with the gate insulating layer, the source electrode, and the drain electrode.

A material of the semiconductor layer is not particularly limited and may be appropriately selected depending on the intended purpose. Examples of the material include silicon semiconductors and oxide semiconductors.

Examples of the silicon conductors include amorphous silicon and polycrystalline silicon.

Examples of the oxide semiconductors include In—Ga—Zn—O, In—Zn—O, and In—Mg—O.

Among these examples, oxide semiconductors are preferable.

—Formation Method of Semiconductor Layer—

A formation method of the semiconductor layer is not particularly limited and may be appropriately selected depending on the intended purpose. Examples of the formation method include: a method of forming a film through a vacuum process (e.g., sputtering, pulsed laser deposition (PLD), chemical vapor deposition (CVD), or atomic layer deposition (ALD)) or a solution process (e.g., dip coating, spin coating, or die coating) and patterning the film through photolithography; and a method of directly forming a film having a desired shape through a printing method, such as inkjet printing, nanoimprinting, or gravure printing.

An average film thickness of the semiconductor layer is not particularly limited and may be appropriately selected depending on the intended purpose. However, the average film thickness of the semiconductor layer is preferably from 5 nm through 1 µm, more preferably from 10 nm through 0.5 µm.

<Gate Electrode>

The gate electrode is not particularly limited and may be appropriately selected depending on the intended purpose, so long as the gate electrode is an electrode configured to apply gate voltage to the field-effect transistor.

The gate electrode is in contact with the gate insulating layer and faces the semiconductor layer via the gate insulating layer.

A material of the gate electrode is not particularly limited and may be appropriately selected depending on the intended purpose. Examples of the material include: metals (e.g., Mo, Al, Au, Ag, and Cu) and alloys of these metals; transparent conductive oxides, such as indium tin oxide (ITO) and antimony-doped tin oxide (ATO); and organic conductors, such as polyethylene dioxythiophene (PEDOT) and polyaniline (PANI).

—Formation Method of Gate Electrode—

A formation method of the gate electrode is not particularly limited and may be appropriately selected depending on the intended purpose. Examples of the formation method include: (i) a method of forming a film through sputtering, or dip coating and patterning the film through photolithography; and (ii) a method of directly forming a film having a desired shape through a printing process, such as inkjet printing, nanoimprinting, or gravure printing.

An average film thickness of the gate electrode is not particularly limited and may be appropriately selected depending on the intended purpose. However, the average film thickness of the gate electrode is preferably from 20 nm through 1 µm, more preferably from 50 nm through 300 nm.

A structure of the field-effect transistor is not particularly limited and may be appropriately selected depending on the intended purpose. Examples of the structure of the field-effect transistor include the following structures:

(1) a field-effect transistor containing the substrate, the gate electrode formed on the substrate, the gate insulating layer formed on the gate electrode, the source electrode and the drain electrode formed on the gate insulating layer, the semiconductor layer formed between the source electrode and the drain electrode, and the passivation layer formed on the semiconductor layer; and (2) a field-effect transistor containing the substrate, the source electrode and the drain electrode formed on the substrate, the semiconductor layer formed between the source electrode and the drain electrode, the gate insulating layer formed on the source electrode, the drain electrode, and the semiconductor layer, the gate electrode formed on the gate insulating layer, and the passivation layer formed on the gate electrode.

Figure 3A:
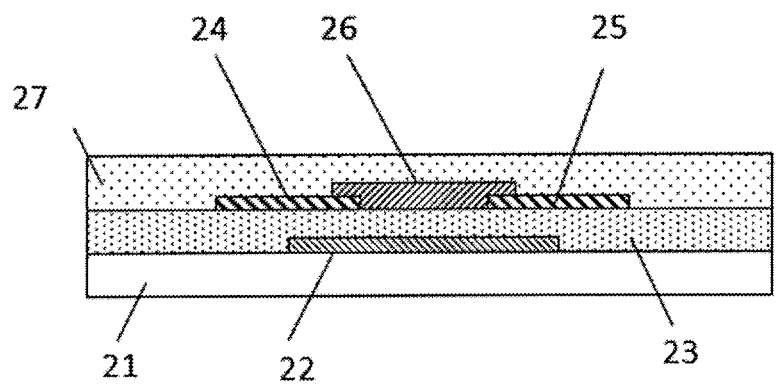
FIG. 3A is a view illustrating one example (bottom contact/bottom gate) of a field-effect transistor of the present disclosure.
Figure 3B:
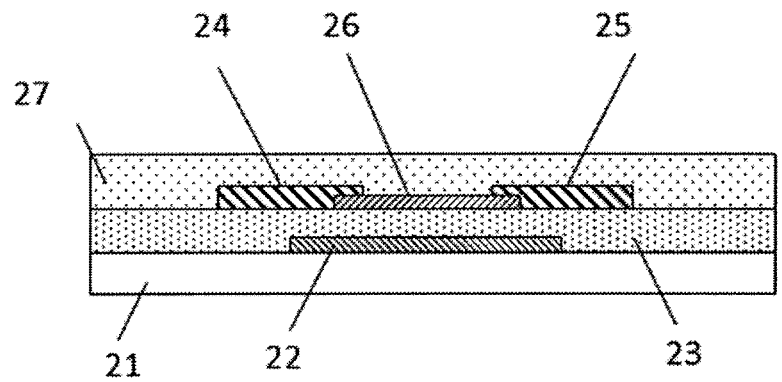
FIG. 3B is a view illustrating one example (top contact/bottom gate) of a field-effect transistor of the present disclosure.

Examples of the field-effect transistor having the structure of (1) include a bottom contact/bottom gate field-effect transistor (FIG. 3A) and a top contact/bottom gate field-effect transistor (FIG. 3B).

Figure 3C:
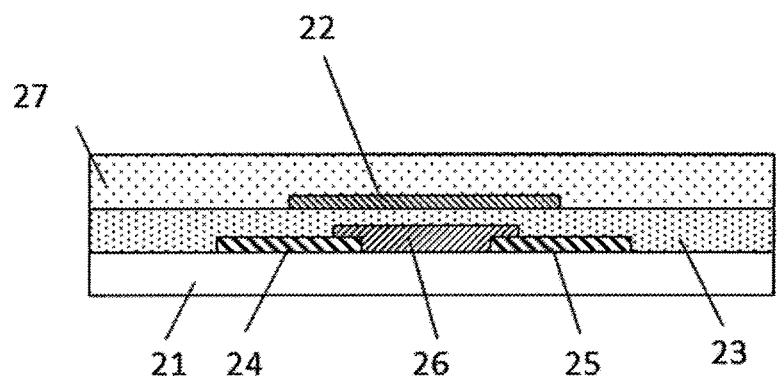
FIG. 3C is a view illustrating one example (bottom contact/top gate) of a field-effect transistor of the present disclosure.
Figure 3D:
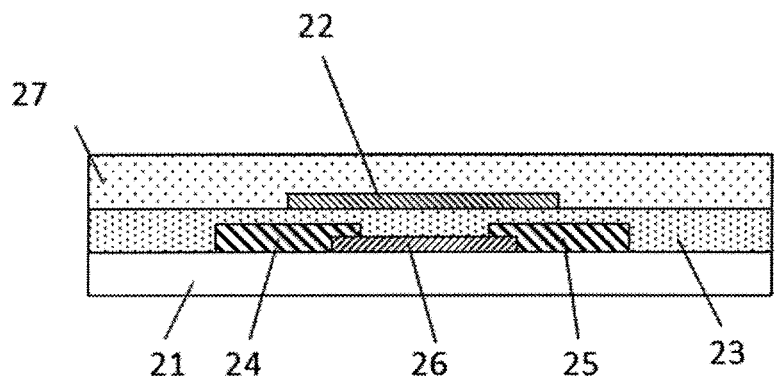
FIG. 3D is a view illustrating one example (top contact/top gate) of a field-effect transistor of the present disclosure.

Examples of the field-effect transistor having the structure of (2) include a bottom contact/top gate field-effect transistor (FIG. 3C) and a top contact/top gate field-effect transistor (FIG. 3D).

In FIGS. 3A to 3D, reference numeral 21 denotes a substrate, 22 denotes a gate electrode, 23 denotes a gate insulating layer, 24 denotes a source electrode, 25 denotes a drain electrode, 26 denotes an oxide semiconductor layer, and 27 denotes a passivation layer.

The field-effect transistor is suitably used in the display element described below, but use of the field-effect transistor is not limited to the use in the display element. For example, the field-effect transistor can be used for IC cards and ID tags.

(Display Element)

A display element of the present disclosure contains at least a light control element and a driving circuit configured to drive the light control element and further contains other members according to the necessity.

<Light Control Element>

The light control element is not particularly limited and may be appropriately selected depending on the intended purpose, so long as the light control element is an element configured to control light output according to a driving signal. Examples of the light control element include electroluminescent (EL) elements, electrochromic (EC) elements, liquid crystal elements, electrophoretic elements, and electrowetting elements.

<Driving Circuit>

The driving circuit is not particularly limited and may be appropriately selected depending on the intended purpose, so long as the driving circuit is a circuit containing the field-effect transistor of the present disclosure and configured to drive the light control element.

<Other Members>

The other members are not particularly limited and may be appropriately selected depending on the intended purpose.

Because the display element includes the field-effect transistor of the present disclosure, long service life and high-speed operation can be realized.

(Image Display Device)

An image display device of the present disclosure includes at least a plurality of display elements, a plurality of wired lines, and a display control device. The image display device further includes other members according to the necessity.

The image display device is a device configured to display an image corresponding to image data.

<Display Elements>

The plurality of display elements are not particularly limited and may be appropriately selected depending on the intended purpose, so long as the plurality of display elements are the display elements of the present disclosure arranged in a form of matrix.

<Wired Lines>

The plurality of wired lines are not particularly limited and may be appropriately selected depending on the intended purpose, so long as the plurality of wired lines are wired lines configured to individually apply gate voltage to the field-effect transistors in the plurality of display elements.

<Display Control Device>

The display control device is not particularly limited and may be appropriately selected depending on the intended purpose, so long as the display control device is a device configured to individually control the gate voltage of the field-effect transistors via the plurality of wired lines correspondingly to the image data.

<Other Members>

The other members are not particularly limited and may be appropriately selected depending on the intended purpose.

Because the image display device includes the display elements of the present disclosure, long service life and high-speed operation can be realized.

The image display device can be used as a display unit in mobile information devices (e.g., mobile phones, portable music players, portable video players, electronic books, and personal digital assistants (PDAs)) and camera devices (e.g., still cameras and video cameras). Moreover, the image display device can be used as a unit configured to display various pieces of information in transportation systems (e.g., cars, aircraft, trains, and ships). Furthermore, the image display device can be used as a unit configured to display various pieces of information in measuring devices, analysis devices, medical equipment, and advertising media.

(System)

A system of the present disclosure includes at least the image display device of the present disclosure and an image-data-generating device.

The image-data-generating device is a device configured to generate image data based on image information to be displayed and to output the image data to the image display device.

The display element, the image display device, and the system of the present disclosure will next be described with reference to the drawings.

First, a television device will be described as one example of the system of the present disclosure.

For example, the television device as one example of the system of the present disclosure can have the structure described in the paragraphs to [0058] and FIG. 1 in Japanese Unexamined Patent Application [0038] Publication No. 2010-074148.

Next, the image display device of the present disclosure will be described.

Figure 2:
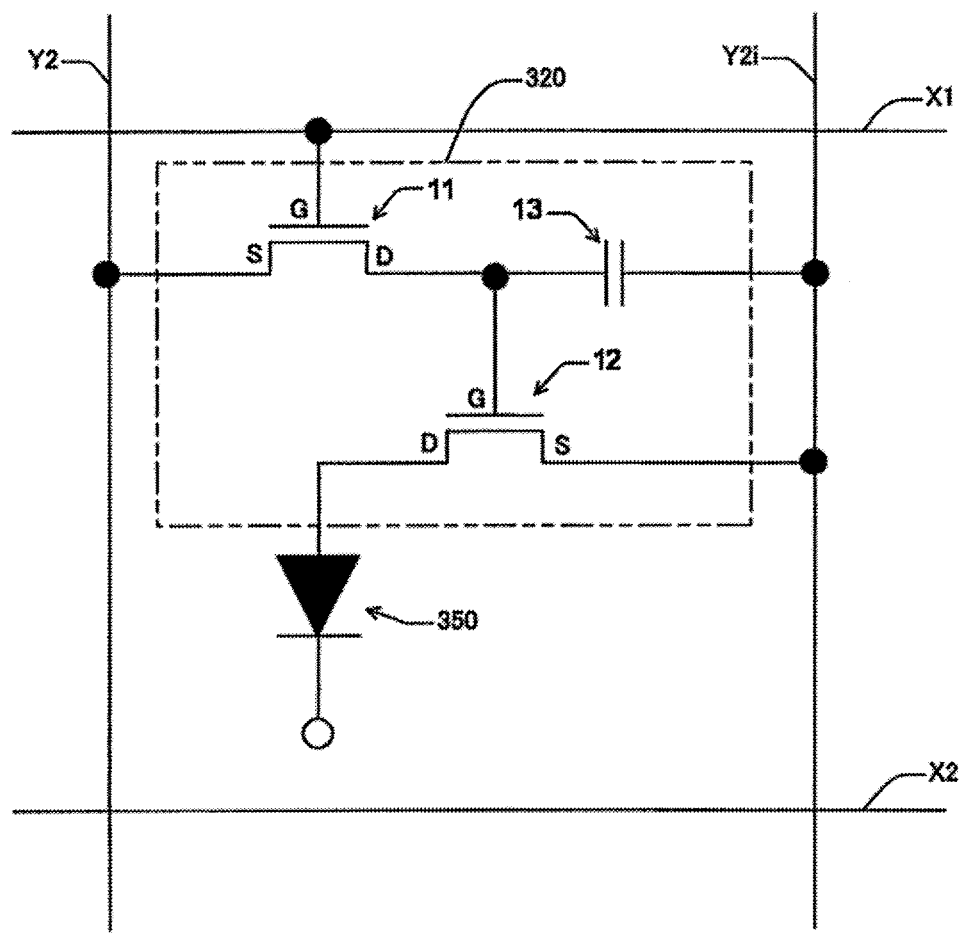
FIG. 2 is a diagram for explaining one example of a display element of the present disclosure.

For example, the image display device of the present disclosure can have the structure described in the paragraphs [0059] and [0060] and FIGS. 2 and 3 in Japanese Unexamined Patent Application Publication No. 2010-074148.

Next, the display element of the present disclosure will be described with reference to the drawings.

FIG. 1 illustrates a display 310 in which display elements are arranged in a form of matrix.

As illustrated in FIG. 1, the display 310 contains "n" scanning lines (X0, X1, X2, X3, ... Xn-2, Xn-1) arranged along the X axis direction at constant intervals, "m" data lines (Y0, Y1, Y2, Y3, ... Ym-1) arranged along the Y axis direction at constant intervals, and "m" current supply lines (Y0i, Y1i, Y2i, Y3i, Ym-1i) arranged along the Y axis direction at constant intervals.

Each of the display elements can be identified by each of the scanning lines and each of the data lines.

FIG. 2 is a schematic diagram illustrating one example of the display element of the present disclosure.

As illustrated as one example in FIG. 2, the display element contains an organic electroluminescent (EL) element 350 and a drive circuit 320 configured to emit light from the organic EL element 350. Specifically, the display 310 is an organic EL display of a so-called active matrix system. The display 310 is a 32-inch color display. Note that, a size of the display is not limited to this size.

The drive circuit 320 of FIG. 2 will be described.

The drive circuit 320 contains two field-effect transistors 11 and 12 and a capacitor 13.

The field-effect transistor 11 operates as a switching element. A gate electrode G is coupled to a predetermined scanning line and a source electrode S is coupled to a predetermined data line. Moreover, a drain electrode D is coupled to one terminal of the capacitor 13.

The capacitor 13 is configured to memorize the state of the field-effect transistor 11; i.e., data. The other terminal of the capacitor 13 is coupled to a predetermined current supply line.

The field-effect transistor 12 is configured to supply large electric current to the organic EL element 350. A gate electrode G is coupled to a drain electrode D of the field-effect transistor 11. A drain electrode D is coupled to an anode of the organic EL element 350 and a source electrode S is coupled to a predetermined current supply line.

When the field-effect transistor 11 turns into the state of "On", the organic EL element 350 is driven by the field-effect transistor 12.

As illustrated as one example in FIG. 3A, the field-effect transistors 11 and 12 each contain a substrate 21, a gate electrode 22, a gate insulating layer 23, a source electrode 24, a drain electrode 25, an oxide semiconductor layer 26, and a passivation layer.

The field-effect transistors 11 and 12 can be formed with the materials and by the processes mentioned in the descriptions of the field-effect transistor of the present disclosure.

Figure 4:
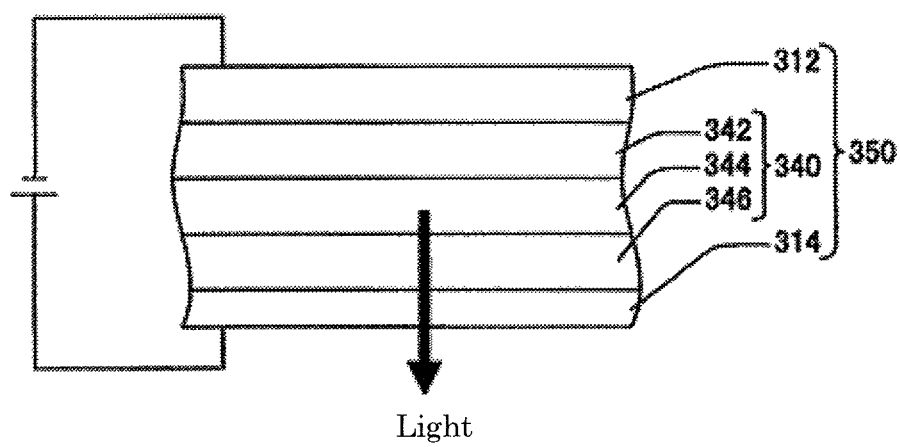
FIG. 4 is a schematic structural view illustrating one example of an organic EL element.

FIG. 4 is a schematic structural view illustrating one example of an organic EL element.

In FIG. 4, the organic EL element 350 contains a cathode 312, an anode 314, and an organic EL thin film layer 340.

A material of the cathode 312 is not particularly limited and may be appropriately selected depending on the intended purpose. Examples of the material include aluminium (Al), magnesium (Mg)-silver (Ag) alloy, aluminium (Al)-lithium (Li) alloy, and indium tin oxide (ITO). Note that, the magnesium (Mg)-silver (Ag) alloy becomes a high-reflective electrode if having a sufficient thickness, and an extremely thin film (less than about 20 nm) of the Mg—Ag alloy becomes a semi-transparent electrode. In FIG. 4, light is taken out from the side of the anode, but light can be taken out from the side of the cathode by making the cathode as a transparent or semi-transparent electrode.

A material of the anode 314 is not particularly limited and may be appropriately selected depending on the intended purpose. Examples of the material include indium tin oxide (ITO), indium zinc oxide (IZO), and silver (Ag)-neodymium (Nd) alloy. Note that, in the case where a silver alloy is used, the resultant electrode becomes a high-reflective electrode, which is suitable for taking light out from the side of the cathode.

The organic EL thin film layer 340 contains an electron transporting layer 342, a light emitting layer 344, and a hole transporting layer 346. The electron transporting layer 342 is coupled to a cathode 312, and the hole transporting layer 346 is coupled to an anode 314. The light emitting layer 344 emits light, when a predetermined voltage is applied between the anode 314 and the cathode 312.

Here, the electron transporting layer 342 and the light emitting layer 344 may form a single layer. Moreover, an electron injecting layer may be disposed between the electron transporting layer 342 and the cathode 312. Furthermore, a hole injecting layer may be disposed between the hole transporting layer 346 and the anode 314.

The above-described light control element in FIG. 4 is a so-called "bottom emission" organic EL element, in which light is taken out from the side of the substrate. However, the light control element may be a "top emission" organic EL element, in which light is taken out from the opposite side to the substrate.

Figure 5:
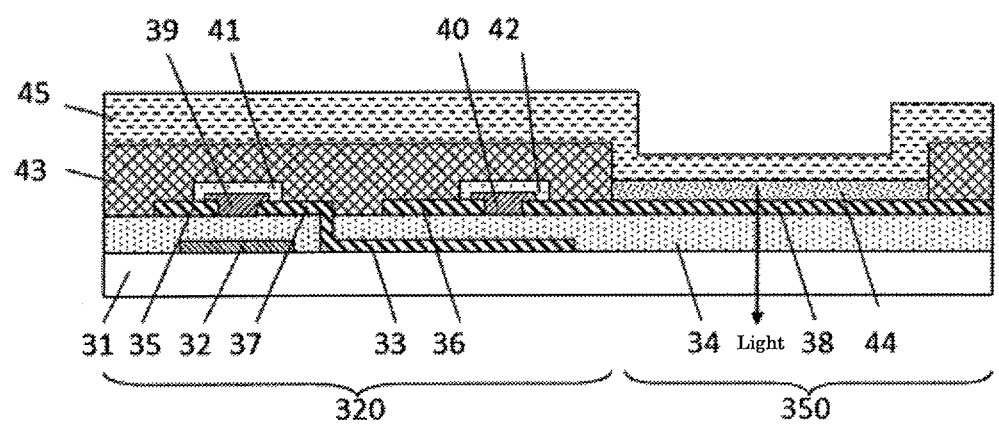
FIG. 5 is a schematic structural view illustrating one example of a display element of the present disclosure.

FIG. 5 illustrates one example of a display element combining an organic EL element 350 and a drive circuit 320.

The display element contains a substrate 31, first and second gate electrodes 32 and 33, a gate insulating layer 34, first and second source electrodes 35 and 36, first and second drain electrodes 37 and 38, first and second oxide semiconductor layers 39 and 40, first and second passivation layers 41 and 42, and an interlayer insulating layer 43, an organic EL layer 44, and a cathode 45. The first drain electrode 37 and the second gate electrode 33 are coupled to each other via a through-hole formed in the gate insulating layer 34.

For the sake of convenience, FIG. 5 is drawn as if the capacitor was formed between the second gate electrode 33 and the second drain electrode 38. In actual, the position of the capacitor formed is not limited and a capacitor having a necessary capacity can be appropriately designed at a necessary position.

In the display element of FIG. 5, the second drain electrode 38 functions as an anode of the organic EL element 350.

The substrate 31, the first and second gate electrodes 32 and 33, the gate insulating layer 34, the first and second source electrodes 35 and 36, the first and second drain electrodes 37 and 38, the first and second oxide semiconductor layers 39 and 40, and the first and second passivation layers 41 and 42 can be formed with the materials and by the processes mentioned in the descriptions of the field-effect transistor of the present disclosure.

Note that, the first passivation layer 41 and the second passivation layer 42 correspond to the passivation layer of the field-effect transistor of the present disclosure. The gate insulating layer 34 corresponds to the gate insulating layer of the field-effect transistor of the present disclosure.

A material of the interlayer insulating layer 43 (planarization layer) is not particularly limited and may be appropriately selected depending on the intended purpose. Examples of the material include organic materials, inorganic materials, and organic-inorganic composite materials.

Examples of the organic materials include: resins, such as polyimide, acrylic resins, fluororesins, non-fluororesins, olefin resins, and silicone resins; and photosensitive resins using these resins.

Examples of the inorganic materials include spin-on-glass (SOG) materials, such as AQUAMICA, available from AZ Electronic Materials.

Examples of the organic-inorganic composite materials include the organic-inorganic composite compounds containing a silane compound disclosed in Japanese Unexamined Patent Application Publication No. 2007-158146.

The interlayer insulating layer preferably has barrier properties against moisture, oxygen, and hydrogen contained in the atmosphere.

A formation process of the interlayer insulating layer is not particularly limited and may be appropriately selected depending on the intended purpose. Examples of the formation process include: a method of directly forming a film having a desired shape through spin coating, inkjet printing, slit coating, nozzle printing, gravure printing, or dip coating; and a method of patterning a photosensitive material through photolithography.

It is effective to perform a heat treatment as a post treatment after the formation of the interlayer insulating layer to stabilize characteristics of the field-effect transistor constituting the display element.

Production methods of the organic EL layer 44 and the cathode 45 are not particularly limited and may be appropriately selected depending on the intended purpose. Examples of the production methods include: vacuum film forming methods (e.g., vacuum deposition and sputtering); and solution processes (e.g., inkjet printing and nozzle coating).

With these methods, it is possible to produce a display element which is a so-called "bottom emission" organic EL element where emitted light is taken out from the side of the substrate. In this case, the substrate 31, the gate insulating layer 34, and the second drain electrode (anode) 38 are required to be transparent.

Figure 6:
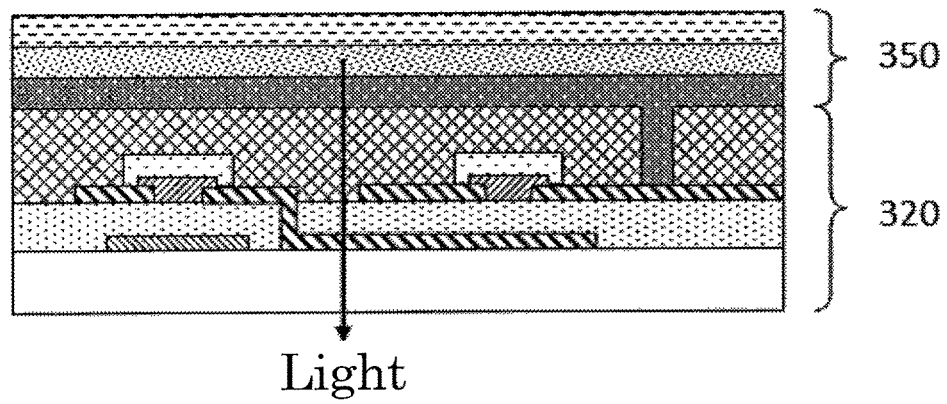
FIG. 6 is a schematic structural view illustrating another example of a display element of the present disclosure.

In FIG. 5, the structure where the organic EL element 350 is disposed next to the drive circuit 320 has been described. However, as illustrated in FIG. 6, the structure of the display element may be a structure where the organic EL element 350 is disposed above the drive circuit 320. Also in this case, the organic EL element is a so-called "bottom emission" organic EL element where emitted light is taken out from the side of the substrate, and therefore the drive circuit 320 is required to be transparent. As for the source electrode and the drain electrode or the anode, preferably used are conductive transparent oxides, such as ITO, $In_2O_3$, $SnO_2$, ZnO, Ga-doped ZnO, Al-doped ZnO, and Sb-doped $SnO_2$.

Figure 7:
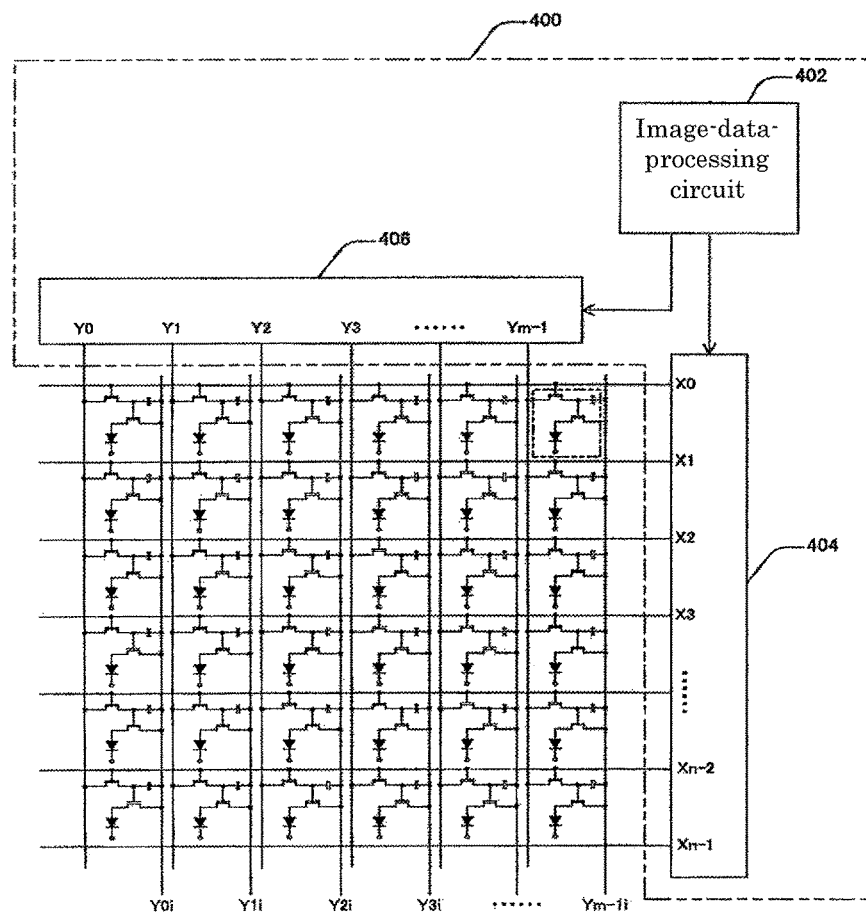
FIG. 7 is a diagram for explaining a display control device.

As illustrated as one example in FIG. 7, the display control device 400 contains an image-data-processing circuit 402, a scanning-line-driving circuit 404, and a data-line-driving circuit 406.

The image-data-processing circuit 402 determines brightness of a plurality of display elements 302 in the display 310 based on output signals of the image output circuit.

The scanning-line-driving circuit 404 individually applies voltage to "n" scanning lines according to the instructions of the image-data-processing circuit 402.

The data-line-driving circuit 406 individually applies voltage to "m" data lines according to the instructions of the image-data-processing circuit 402.

Note that, the above embodiment refers to a case where the organic EL thin film layer contains an electron transporting layer, a light emitting layer, and a hole transporting layer, but this embodiment is not limitative. For example, an electron transporting layer and a light emitting layer may be combined as a single layer. Moreover, an electron injecting layer may be disposed between the electron transporting layer and the cathode. Furthermore, a hole injecting layer may be disposed between the hole transporting layer and the anode.

The above embodiment refers to a so-called "bottom emission" organic EL element where emitted light is taken out from the side of the substrate, but this embodiment is not limitative. For example, light may be taken out from the opposite side of the substrate by using a high-reflective electrode (e.g., a silver (Ag)-neodymium (Nd) alloy electrode) as the anode 314 and using a semi-transparent electrode (e.g., a magnesium (Mg)-silver (Ag) alloy electrode) or a transparent electrode (e.g., an ITO electrode) as the cathode 312.

The above embodiment refers to a case where the light control element is an organic EL element, but this embodiment is not limitative. For example, the light control element may be an electrochromic element. In this case, the display 310 is an electrochromic display.

Figure 8:
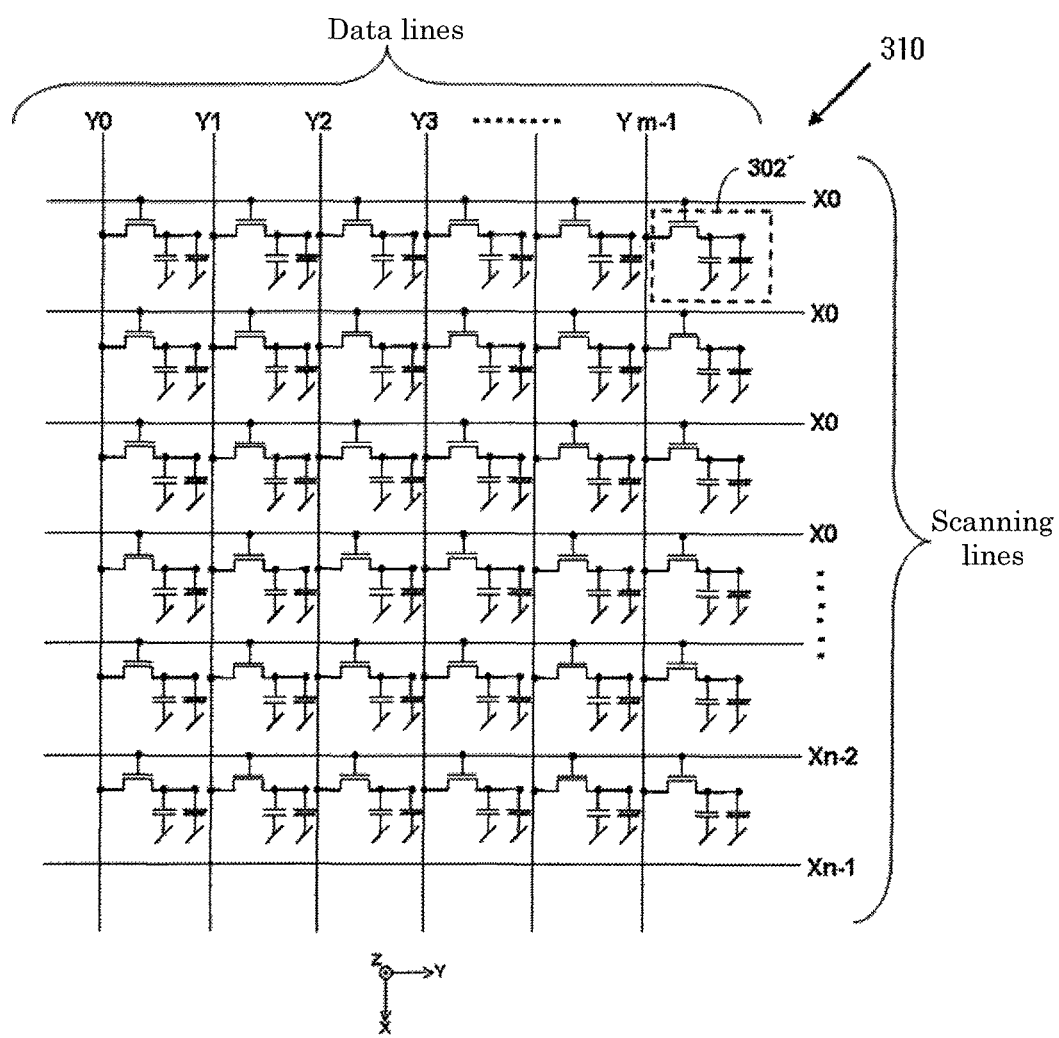
FIG. 8 is a diagram for explaining a liquid crystal display.

The light control element may be a liquid crystal element. In this case, the display 310 is a liquid crystal display. As illustrated as one example in FIG. 8, it is not necessary to provide a current supply line for a display element 302'.

Figure 9:
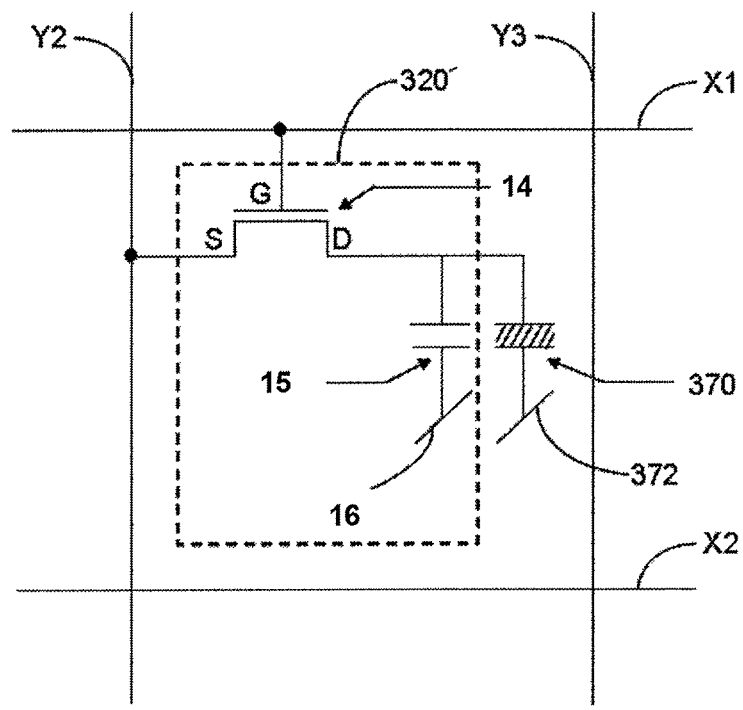
FIG. 9 is a diagram for explaining a display element in FIG. 8.

Alternatively, as illustrated as one example in FIG. 9, a drive circuit 320' may be produced with one field-effect transistor 14, which is similar to each of the field-effect transistors (11 and 12), and a capacitor 15. In the field-effect transistor 14, a gate electrode G is coupled to a predetermined scanning line and a source electrode S is coupled to a predetermined data line. Moreover, a drain electrode D is coupled to a pixel electrode of a liquid crystal element 370 and the capacitor 15. Note that, in FIG. 9, referential numerals 16 and 372 each denote a counter electrode (common electrode) of the liquid crystal element 370.

In the above embodiment, the light control element may be an electrophoretic element. Moreover, the light control element may be an electrowetting element.

The above embodiment refers to a case where the display is a color display, but this embodiment is not limitative.

Note that, the field-effect transistor according to the present embodiment can also be used for products other than the display elements (e.g., IC cards and ID tags).

The display element, the image display device, and the system each using the field-effect transistor of the present disclosure achieve high-speed operations and a long service life.

EXAMPLES

The present disclosure will next be described by way of Examples, but the Examples should not be construed to limit the present disclosure in any way. In the Examples below, the unit "%" denotes "% by mass", unless otherwise specified.

Example 1

<Production of Field-Effect Transistor>
—Preparation of Second-Gate-Insulating-Layer-Coating Liquid—

In 1.2 mL of cyclohexylbenzene, 0.53 g of yttrium 2-ethylhexanoate (Strem 39-2400, available from Strem Chemicals Inc.) and 0.11 mL of a toluene solution of magnesium 2-ethylhexanoate (Mg content: 3%, Strem 12-1260, available from Strem Chemicals Inc.) were mixed, to obtain a passivation-layer-coating liquid. A paraelectric amorphous oxide formed with the passivation-layer-coating liquid would have the composition as presented in Table 1-1.

Figure 10:
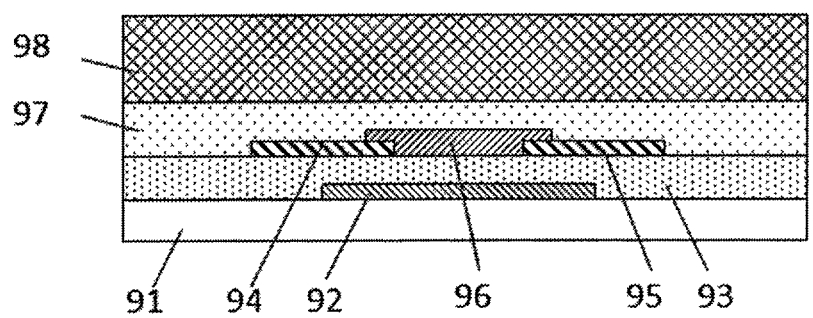
FIG. 10 is a schematic view illustrating field-effect transistors produced in Examples 1 to 7 and Comparative Example 1.

Next, a bottom contact/bottom gate field-effect transistor as illustrated in FIG. 10 was produced.

—Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a $SiO_2$ film was formed on the substrate and the gate electrode by chemical vapor deposition (CVD) so as to have an average film thickness of about 300 nm.

—Formation of Source Electrode and Drain Electrode—

Next, a source electrode 94 and a drain electrode 95 were formed on the gate insulating layer 93. Specifically, an Al (aluminium) alloy film was formed on the gate insulating layer 93 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by RIE. Thereafter, the resist pattern was also removed to form the source electrode 94 and the drain electrode 95, each of which was formed of the Al alloy film —Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Passivation Layer—

Next, 0.6 mL of the passivation-layer-coating liquid was dropped and spin-coated on the substrate under predetermined conditions (rotation was performed at 1,000 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a paraelectric amorphous oxide film as a passivation layer 97. The average film thickness of the passivation layer was 135 nm.

—Formation of Interlayer Insulating Layer—

Next, an interlayer insulating layer 98 was formed. Specifically, a positive photosensitive organic-inorganic composite material (ADEKA Nanohybrid Silicone FX series, available from ADEKA CORPORATION) was spin-coated on the passivation layer 97, and the resultant was subjected to prebake, exposure by an exposing device, and developing, to obtain a desired pattern. Thereafter, the resultant was post-baked at 150° C. for 1 hour and then at 200° C. for 1 hour.

Finally, the resultant was subjected to a heat treatment at 230° C. for 1 hour as a heating treatment of a post treatment, to complete a field-effect transistor. The average film thickness of the interlayer insulating layer was about 1,500 nm.

Example 2

<Production of Field-Effect Transistor>
—Preparation of Passivation-Layer-Coating Liquid—

In 1.2 mL of cyclohexylbenzene, 0.26 g of samarium acetylacetonate trihydrate (Strem 93-6226, available from Strem Chemicals Inc.), 0.23 mL of a toluene solution of gadolinium 2-ethylhexanoate (Gd content: 25%, Strem 64-3500, available from Strem Chemicals Inc.), and 0.35 mL of a toluene solution of barium 2-ethylhexanoate (Ba content: 8%, Wako 021-09471, available from Wako Chemical, Ltd.) were mixed, to obtain a passivation-layer-coating liquid. A paraelectric amorphous oxide formed with the passivation-layer-coating liquid would have the composition as presented in Table 1-1.

Next, a bottom contact/bottom gate field-effect transistor as illustrated in FIG. 10 was produced.

—Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a $Si_3N_4$ film was formed on the substrate and the gate electrode by chemical vapor deposition (CVD) so as to have an average film thickness of about 300 nm.

—Formation of Source Electrode and Drain Electrode—

Next, a source electrode 94 and a drain electrode 95 were formed on the gate insulating layer 93. Specifically, an Al (aluminium) alloy film was formed on the gate insulating layer 93 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by RIE. Thereafter, the resist pattern was also removed to form the source electrode 94 and the drain electrode 95, each of which was formed of the Al alloy film.

—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Passivation Layer—

Next, 0.6 mL of the passivation-layer-coating liquid was dropped and spin-coated on the substrate under predetermined conditions (rotation was performed at 1,000 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the 02 atmosphere at 400° C. for 3 hours, to form a paraelectric amorphous oxide film as a passivation layer 97. The average film thickness of the passivation layer was 135 nm.

—Formation of Interlayer Insulating Layer—

Next, an interlayer insulating layer 98 was formed. Specifically, a positive photosensitive organic-inorganic composite material (ADEKA Nanohybrid Silicone FX series, available from ADEKA CORPORATION) was spin-coated on the passivation layer 97, and the resultant was subjected to prebake, exposure by an exposing device, and developing, to obtain a desired pattern. Thereafter, the resultant was post-baked at 150° C. for 1 hour and then at 200° C. for 1 hour.

Finally, the resultant was subjected to a heat treatment at 230° C. for 1 hour as a heating treatment of a post treatment, to complete a field-effect transistor. The average film thickness of the interlayer insulating layer was about 1,500 nm.

Example 3

<Production of Field-Effect Transistor>

—Preparation of Passivation-Layer-Coating Liquid—

In 1.2 mL of cyclohexylbenzene, 0.45 g of dysprosium acetylacetonate trihydrate (Strem 66-2002, available from Strem Chemicals Inc.), 0.34 mL of a toluene solution of strontium 2-ethylhexanoate (Sr content: 2%, Wako 195-09561, available from Wako Chemical, Ltd.), and 0.19 mL of a toluene solution of barium 2-ethylhexanoate (Ba content: 8%, Wako 021-09471, available from Wako Chemical, Ltd.) were mixed, to obtain a passivation-layer-coating liquid. A paraelectric amorphous oxide formed with the passivation-layer-coating liquid would have the composition as presented in Table 1-1.

Next, a bottom contact/bottom gate field-effect transistor as illustrated in FIG. 10 was produced.

—Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a SiON film was formed on the substrate and the gate electrode by chemical vapor deposition (CVD) so as to have an average film thickness of about 300 nm.

—Formation of Source Electrode and Drain Electrode—

Next, a source electrode 94 and a drain electrode 95 were formed on the gate insulating layer 93. Specifically, an Al (aluminium) alloy film was formed on the gate insulating layer 93 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by RIE. Thereafter, the resist pattern was also removed to form the source electrode 94 and the drain electrode 95, each of which was formed of the Al alloy film.

—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

Formation of Passivation Layer—

Next, 0.6 mL of the passivation-layer-coating liquid was dropped and spin-coated on the substrate under predetermined conditions (rotation was performed at 1,000 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a paraelectric amorphous oxide film as a passivation layer 97. The average film thickness of the passivation layer was 135 nm.

—Formation of Interlayer Insulating Layer—

Next, an interlayer insulating layer 98 was formed. Specifically, a positive photosensitive organic-inorganic composite material (ADEKA Nanohybrid Silicone FX series, available from ADEKA CORPORATION) was spin-coated on the passivation layer 97, and the resultant was subjected to prebake, exposure by an exposing device, and developing, to obtain a desired pattern. Thereafter, the resultant was post-baked at 150° C. for 1 hour and then at 200° C. for 1 hour.

Finally, the resultant was subjected to a heat treatment at 230° C. for 1 hour as a heating treatment of a post treatment, to complete a field-effect transistor. The average film thickness of the interlayer insulating layer was about 1,500 nm.

Example 4

<Production of Field-Effect Transistor>

—Preparation of Passivation-Layer-Coating Liquid—

In 1.2 mL of cyclohexylbenzene, 1.95 mL of a toluene solution of lanthanum 2-ethylhexanoate (La content: 7%, Wako 122-03371, available from Wako Chemical, Ltd.), 0.57 mL of a toluene solution of strontium 2-ethylhexanoate (Sr content: 2%, Wako 195-09561, available from Wako Chemical, Ltd.), and 0.09 mL of a mineral spirit solution of zirconium oxide 2-ethylhexanoate (Zr content: 12%, Wako 269-01116, available from Wako Chemical, Ltd.) were mixed, to obtain a passivation-layer-coating liquid. A paraelectric amorphous oxide formed with the passivation-layer-coating liquid would have the composition as presented in Table 1-1.

Next, a bottom contact/bottom gate field-effect transistor as illustrated in FIG. 10 was produced.

Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a SiO$_2$ film was formed on the substrate and the gate electrode by chemical vapor deposition (CVD) so as to have an average film thickness of about 300 nm.

—Formation of Source Electrode and Drain Electrode—

Next, a source electrode 94 and a drain electrode 95 were formed on the gate insulating layer 93. Specifically, an Al (aluminium) alloy film was formed on the gate insulating layer 93 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by RIE. Thereafter, the resist pattern was also removed to form the source electrode 94 and the drain electrode 95, each of which was formed of the Al alloy film.

—Formation of Oxide Semiconductor Layer—

Next, an oxide semiconductor layer 96 was formed. Specifically, a Mg—In based oxide (In$_2$MgO$_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Passivation Layer—

Next, 0.6 mL of the passivation-layer-coating liquid was dropped and spin-coated on the substrate under predetermined conditions (rotation was performed at 1,000 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the O$_2$ atmosphere at 400° C. for 3 hours, to form a paraelectric amorphous oxide film as a passivation layer 97. The average film thickness of the passivation layer was 135 nm.

—Formation of Interlayer Insulating Layer—

Next, an interlayer insulating layer 98 was formed. Specifically, a positive photosensitive organic-inorganic composite material (ADEKA Nanohybrid Silicone FX series, available from ADEKA CORPORATION) was spin-coated on the passivation layer 97, and the resultant was subjected to prebake, exposure by an exposing device, and developing, to obtain a desired pattern. Thereafter, the resultant was post-baked at 150° C. for 1 hour and then at 200° C. for 1 hour.

Finally, the resultant was subjected to a heat treatment at 230° C. for 1 hour as a heating treatment of a post treatment, to complete a field-effect transistor. The average film thickness of the interlayer insulating layer was about 1,500 nm.

Example 5

<Production of Field-Effect Transistor>

—Preparation of Passivation-Layer-Coating Liquid—

In 1.2 mL of cyclohexylbenzene, 0.60 g of scandium(III) tris(2,2,6,6-tetramethyl-3,5-heptanedionate)hydrate (SIGMA-ALDRICH 517607, available from SIGMA-ALDRICH CO., LLC.), 0.09 mL of a toluene solution of magnesium 2-ethylhexanoate (Mg content: 3%, Strem 12-1260, available from Strem Chemicals Inc.), and 0.03 mL of a 2-ethylhexanoic acid solution of hafnium 2-ethylhexanoate (Gelest AKH332, available from Gelest, Inc.) were mixed, to obtain a passivation-layer-coating liquid. A paraelectric amorphous oxide formed with the passivation-layer-coating liquid would have the composition as presented in Table 1-2.

Next, a bottom contact/bottom gate field-effect transistor as illustrated in FIG. 10 was produced.

—Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a $Si_3N_4$ film was formed on the substrate and the gate electrode by chemical vapor deposition (CVD) so as to have an average film thickness of about 300 nm.

—Formation of Source Electrode and Drain Electrode—

Next, a source electrode 94 and a drain electrode 95 were formed on the gate insulating layer 93. Specifically, an Al (aluminium) alloy film was formed on the gate insulating layer 93 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by RIE. Thereafter, the resist pattern was also removed to form the source electrode 94 and the drain electrode 95, each of which was formed of the Al alloy film.

—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Passivation Layer—

Next, 0.6 mL of the passivation-layer-coating liquid was dropped and spin-coated on the substrate under predetermined conditions (rotation was performed at 1,000 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a paraelectric amorphous oxide film as a passivation layer 97. The average film thickness of the passivation layer was 135 nm.

—Formation of Interlayer Insulating Layer—

Next, an interlayer insulating layer 98 was formed. Specifically, a positive photosensitive organic-inorganic composite material (ADEKA Nanohybrid Silicone FX series, available from ADEKA CORPORATION) was spin-coated on the passivation layer 97, and the resultant was subjected to prebake, exposure by an exposing device, and developing, to obtain a desired pattern. Thereafter, the resultant was post-baked at 150° C. for 1 hour and then at 200° C. for 1 hour.

Finally, the resultant was subjected to a heat treatment at 230° C. for 1 hour as a heating treatment of a post treatment, to complete a field-effect transistor. The average film thickness of the interlayer insulating layer was about 1,500 nm.

Example 6

<Production of Field-Effect Transistor>

—Preparation of Passivation-Layer-Coating Liquid—

In 1.2 mL of cyclohexylbenzene, 0.05 mL of a 2-ethylhexanoic acid solution of neodymium 2-ethylhexanoate (Nd content: 12%, Strem 60-2400, available from Strem Chemicals Inc.), 0.32 g of europium 2-ethylhexanoate (Strem 93-6311, available from Strem Chemicals Inc.), 0.12 mL of a toluene solution of barium 2-ethylhexanoate (Ba content: 8%, Wako 021-09471, available from Wako Chemical, Ltd.), 0.03 mL of a mineral spirit solution of zirconium oxide 2-ethylhexanoate (Zr content: 12%, Wako 269-01116, available from Wako Chemical, Ltd.), and 0.06 mL of a 2-ethylhexanoic acid solution of hafnium 2-ethylhexanoate (Gelest AKH332, available from Gelest, Inc.) were mixed, to obtain a passivation-layer-coating liquid. A paraelectric amorphous oxide formed with the passivation-layer-coating liquid would have the composition as presented in Table 1-2.

Next, a bottom contact/bottom gate field-effect transistor as illustrated in FIG. 10 was produced.

—Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a SiON film was formed on the substrate and the gate electrode by chemical vapor deposition (CVD) so as to have an average film thickness of about 300 nm.

—Formation of Source Electrode and Drain Electrode—

Next, a source electrode 94 and a drain electrode 95 were formed on the gate insulating layer 93. Specifically, an Al (aluminium) alloy film was formed on the gate insulating layer 93 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by RIE. Thereafter, the resist pattern was also removed to form the source electrode 94 and the drain electrode 95, each of which was formed of the Al alloy film —Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Passivation Layer—

Next, 0.6 mL of the passivation-layer-coating liquid was dropped and spin-coated on the substrate under predetermined conditions (rotation was performed at 1,000 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a paraelectric amorphous oxide film as a passivation layer 97. The average film thickness of the passivation layer was 135 nm.

—Formation of Interlayer Insulating Layer—

Next, an interlayer insulating layer 98 was formed. Specifically, a positive photosensitive organic-inorganic composite material (ADEKA Nanohybrid Silicone FX series, available from ADEKA CORPORATION) was spin-coated on the passivation layer 97, and the resultant was subjected to prebake, exposure by an exposing device, and developing, to obtain a desired pattern. Thereafter, the resultant was post-baked at 150° C. for 1 hour and then at 200° C. for 1 hour.

Finally, the resultant was subjected to a heat treatment at 230° C. for 1 hour as a heating treatment of a post treatment, to complete a field-effect transistor. The average film thickness of the interlayer insulating layer was about 1,500 nm.

Example 7

<Production of Field-Effect Transistor>
—Preparation of Passivation-Layer-Coating Liquid—

In 1.2 mL of cyclohexylbenzene, 0.49 g of ytterbium acetylacetonate trihydrate (Strem 70-2202, available from Strem Chemicals Inc.), 0.03 mL of a 2-ethylhexanoic acid solution of calcium 2-ethylhexanoate (Ca content: from 3% through 8%, Alfa36657, available from Alfa Aesar), 0.09 mL of a toluene solution of strontium 2-ethylhexanoate (Sr content: 2%, Wako 195-09561, available from Wako Chemical, Ltd.), 0.03 mL of a mineral spirit solution of zirconium oxide 2-ethylhexanoate (Zr content: 12%, Wako 269-01116, available from Wako Chemical, Ltd.), and 0.01 mL of a 2-ethylhexanoic acid solution of hafnium 2-ethylhexanoate (Gelest AKH332, available from Gelest, Inc.) were mixed, to obtain a passivation-layer-coating liquid. A paraelectric amorphous oxide formed with the passivation-layer-coating liquid would have the composition as presented in Table 1-2.

Next, a bottom contact/bottom gate field-effect transistor as illustrated in FIG. 10 was produced.

—Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a $SiO_2$ film was formed on the substrate and the gate electrode by chemical vapor deposition (CVD) so as to have an average film thickness of about 300 nm.

—Formation of Source Electrode and Drain Electrode—

Next, a source electrode 94 and a drain electrode 95 were formed on the gate insulating layer 93. Specifically, an Al (aluminium) alloy film was formed on the gate insulating layer 93 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by RIE. Thereafter, the resist pattern was also removed to form the source electrode 94 and the drain electrode 95, each of which was formed of the Al alloy film.

—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Passivation Layer—

Next, 0.6 mL of the passivation-layer-coating liquid was dropped and spin-coated on the substrate under predetermined conditions (rotation was performed at 1,000 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a paraelectric amorphous oxide film as a passivation layer 97. The average film thickness of the passivation layer was 135 nm.

—Formation of Interlayer Insulating Layer—

Next, an interlayer insulating layer 98 was formed. Specifically, a positive photosensitive organic-inorganic composite material (ADEKA Nanohybrid Silicone FX series, available from ADEKA CORPORATION) was spin-coated on the passivation layer 97, and the resultant was subjected to prebake, exposure by an exposing device, and developing, to obtain a desired pattern. Thereafter, the resultant was post-baked at 150° C. for 1 hour and then at 200° C. for 1 hour.

Finally, the resultant was subjected to a heat treatment at 230° C. for 1 hour as a heating treatment of a post treatment, to complete a field-effect transistor. The average film thickness of the interlayer insulating layer was about 1,500 nm.

Comparative Example 1

<Production of Field-Effect Transistor>
—Preparation of Passivation-Layer-Coating Liquid—

In 1 mL of toluene, 0.31 mL of a toluene solution of gadolinium 2-ethylhexanoate (Gd content: 25 wt %, Strem 64-3500, available from Strem Chemicals Inc.) and 0.23 mL of a toluene solution of barium 2-ethylhexanoate (Ba content: 8 wt %, Wako 021-09471, available from Wako Chemical, Ltd.) were mixed, to obtain a passivation-layer-coating liquid. A paraelectric amorphous oxide formed with the passivation-layer-coating liquid would have the composition as presented in Table 1-2.

Next, a bottom contact/bottom gate field-effect transistor as illustrated in FIG. 10 was produced.

—Formation of Gate Electrode—

First, a gate electrode 92 was formed on a glass substrate (substrate 91). Specifically, a Mo (molybdenum) film was formed on the glass substrate (substrate 91) by DC sputtering so as to have an average film thickness of about 100 nm. Thereafter, a photoresist was coated on the Mo film, and the resultant was subjected to prebake, exposure by an exposing device, and developing, to form a resist pattern having the same pattern as a pattern of the gate electrode 92 to be formed. Moreover, resist-pattern-free regions of the Mo film were removed by etching. Thereafter, the resist pattern was also removed to form the gate electrode 92 formed of the Mo film.

—Formation of Gate Insulating Layer—

Next, a gate insulating layer 93 was formed on the substrate and the gate electrode. Specifically, an $Al_2O_3$ film was formed as the gate insulating layer 93 on the substrate and the gate electrode by RF sputtering so as to have an average film thickness of about 300 nm.

—Formation of Source Electrode and Drain Electrode—

Next, a source electrode 94 and a drain electrode 95 were formed on the gate insulating layer 93. Specifically, a Mo (molybdenum) film was formed on the gate insulating layer 93 by DC sputtering so as to have an average film thickness of about 100 nm. Thereafter, a photoresist was coated on the Mo film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Mo film were removed by RIE. Thereafter, the resist pattern was also removed to form the source electrode 94 and the drain electrode 95, each of which was formed of the Mo film.

—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Passivation Layer—

Next, 0.4 mL of the passivation-layer-coating liquid was dropped and spin-coated on the substrate under predetermined conditions (rotation was performed at 3,000 rpm for 20 seconds and the rotation was stopped so as to be 0 rpm in 5 seconds). Subsequently, the resultant was subjected to an evaporation treatment in the atmosphere at 120° C. for 1 hour and then baking in the 02 atmosphere at 400° C. for 3 hours, to form a paraelectric amorphous oxide film as a passivation layer 97.

—Formation of Interlayer Insulating Layer—

Next, an interlayer insulating layer 98 was formed. Specifically, a positive photosensitive organic-inorganic composite material (ADEKA Nanohybrid Silicone FX series, available from ADEKA CORPORATION) was spin-coated on the passivation layer 97, and the resultant was subjected to prebake, exposure by an exposing device, and developing, to obtain a desired pattern. Thereafter, the resultant was post-baked at 150° C. for 1 hour and then at 200° C. for 1 hour.

Finally, the resultant was subjected to a heat treatment at 230° C. for 1 hour as a heating treatment of a post treatment, to complete a field-effect transistor. The average film thickness of the interlayer insulating layer was about 1,500 nm.

TABLE 1-1

| | | Ex. 1 Ratios by mole of oxides mol % | Ex. 2 Ratios by mole of oxides mol % | Ex. 3 Ratios by mole of oxides mol % | Ex. 4 Ratios by mole of oxides mol % |
|---|---|---|---|---|---|
| | Oxide | | | | |
| Paraelectric amorphous oxide | $Sc_2O_3$ | | | | |
| | $Y_2O_3$ | 80.0 | | | |
| | $La_2O_3$ | | | | 66.6 |
| | $Nd_2O_3$ | | | | |
| | $Sm_2O_3$ | | 43.2 | | |
| | $Eu_2O_3$ | | | | |
| | $Gd_2O_3$ | | 26.8 | | |
| | $Dy_2O_3$ | | | 72.9 | |
| | $Yb_2O_3$ | | | | |
| | MgO | 20.0 | | | |
| | CaO | | | | |
| | SrO | | | 10.3 | 16.7 |
| | BaO | | 30.0 | 16.8 | |
| | $ZrO_2$ | | | | 16.7 |
| | $HfO_2$ | | | | |
| | Total | 100.0 | 100.0 | 100.0 | 100.0 |

TABLE 1-2

| | | Ex. 5 Ratios by mole of oxides mol % | Ex. 6 Ratios by mole of oxides mol % | Ex. 7 Ratios by mole of oxides mol % | Comp. Ex. 1 Ratios by mole of oxides mol % |
|---|---|---|---|---|---|
| | Oxide | | | | |
| Paraelectric amorphous oxide | $Sc_2O_3$ | 78.3 | | | |
| | $Y_2O_3$ | | | | |
| | $La_2O_3$ | | | | |
| | $Nd_2O_3$ | | 31.3 | | |
| | $Sm_2O_3$ | | | | |
| | $Eu_2O_3$ | | 40.6 | | |
| | $Gd_2O_3$ | | | | 65.0 |
| | $Dy_2O_3$ | | | | |
| | $Yb_2O_3$ | | | 84.3 | |
| | MgO | 15.3 | | | |
| | CaO | | | 5.3 | |
| | SrO | | | 2.8 | |
| | BaO | | 10.6 | | 35.0 |
| | $ZrO_2$ | | 5.5 | 5.7 | |
| | $HfO_2$ | 6.4 | 12.0 | 1.9 | |
| | Total | 100.0 | 100.0 | 100.0 | 100.0 |

<Evaluation of Transistor Characteristics of Field-Effect Transistors>

Each of the field-effect transistors produced in Examples 1 to 7 and Comparative Example 1 was evaluated for transistor characteristics after completion of the field-effect transistors.

The transistor characteristics were evaluated by measuring a relationship (Vgs–Ids) between the voltage (Vgs)

between the gate electrode 92 and the source electrode 94 and the current (Ids) between the drain electrode 95 and the source electrode 94, when the voltage between the drain electrode 95 and the source electrode 94 (Vds) was +10 V.

Moreover, a field-effect mobility in a saturated region was calculated from the evaluation result of the transistor characteristics (Vgs–Ids). An Ids ratio (on/off ratio) of an on-state (e.g., Vgs=+10 V) to an off-state (e.g., Vgs=–10 V) of the transistor was calculated. A subthreshold swing (SS) was calculated as an index for sharpness of the rise of Ids upon the application of Vgs. Furthermore, threshold voltage (Vth) was calculated as a voltage value at the time of the rise of Ids upon the application of Vgs.

Table 2 presents the mobility, the on/off ratio, the subthreshold swing, and the Vth calculated from the transistor characteristics of each of the field-effect transistors produced in Examples 1 to 7 and Comparative Example 1. In the results of the transistor characteristics described below, the following results: the mobility is high, the on/off ratio is high, the subthreshold swing is low, and the Vth is around 0 V, are expressed as excellent transistor characteristics. Specifically, when the mobility is 3 cm$^2$/Vs or greater, the on/off ratio is $1.0 \times 10^8$ or greater, the subthreshold swing is 0.7 or less, and the Vth is within a range of ±5 V, the results are expressed as excellent transistor characteristics.

It is found from Table 2 that the field-effect transistors produced in Examples 1 to 7 and Comparative Example 1 had the excellent transistor characteristics; i.e., the mobility is high, the on/off ratio is high, the subthreshold swing is low, and the Vth is within a range of ±5 V.

TABLE 2

| | Transistor characteristics After formation of the interlayer insulating layer | | | |
|---|---|---|---|---|
| | Mobility [cm$^2$/Vs] | on/off ratio [×10$^8$] | Subthreshold swing [V/decade] | Vth [V] |
| Ex. 1 | 5.5 | 3.4 | 0.52 | 3.2 |
| Ex. 2 | 5.1 | 2.5 | 0.53 | 3.5 |
| Ex. 3 | 4.8 | 1.6 | 0.67 | 4.9 |
| Ex. 4 | 6.8 | 4.5 | 0.69 | 2.5 |
| Ex. 5 | 5.6 | 3.6 | 0.50 | 4.5 |
| Ex. 6 | 6.1 | 4.2 | 0.68 | 3.5 |
| Ex. 7 | 6.5 | 4.3 | 0.63 | 3.1 |
| Comp. Ex. 1 | 5.2 | 2.8 | 0.66 | 4.0 |

<Reliability Evaluation of Field-Effect Transistor>

A bias temperature stress (BTS) test was performed on each of the field-effect transistors produced in Examples 1 to 7 and Comparative Example 1 in the atmosphere (temperature: 50° C. and relative humidity: 50%) for 100 hours.

The stress conditions were the following four conditions:
(1) Vgs=+10 V and Vds=0 V;
(2) Vgs=+10 V and Vds=+10 V;
(3) Vgs=–10 V and Vds=0 V; and
(4) Vgs=–10V and Vds=+10 V.

Every time the BTS test proceeded for a certain period of time, a relationship (Vgs–Ids) between Vgs and Ids when Vds=+10 V was measured.

Figure 11:
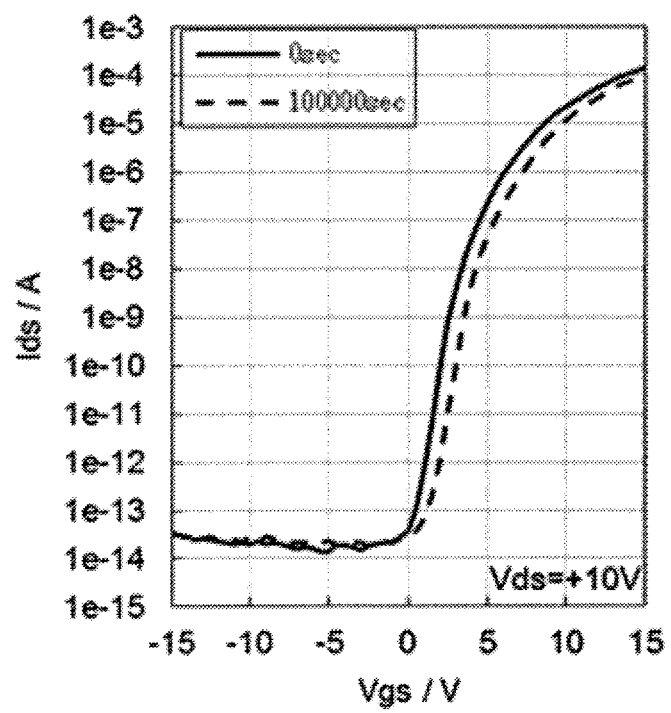
FIG. 11 is a graph in which transistor characteristics (Vgs–Ids) of a field-effect transistor obtained in Example 4 in a BTS test with Vgs=+10 V and Vds=0 V are evaluated.
Figure 12:
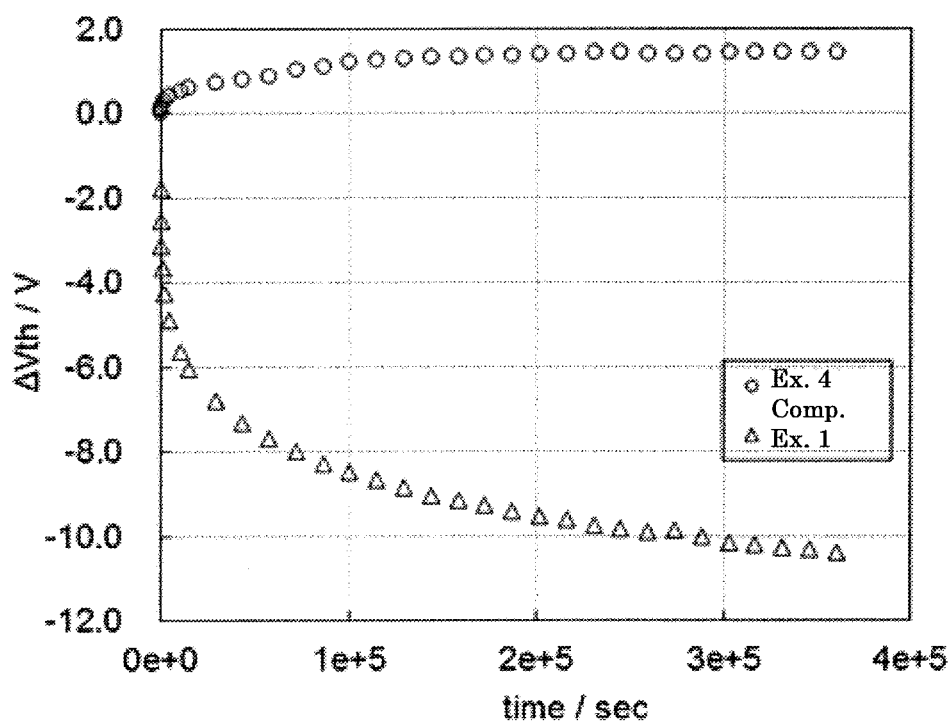
FIG. 12 is a graph in which change ΔVth with respect to stress time of field-effect transistors obtained in Example 4 and Comparative Example 1 in a BTS test with Vgs=+10 V and Vds=0 V are evaluated.

FIG. 11 presents the result of Vgs–Ids in the BTS test performed on the field-effect transistor produced in Example 4, where the stress conditions were Vgs=+10 V and Vds=0 V. FIG. 12 presents the change of the threshold voltage (ΔVth) with respect to the stress time in each of the field-effect transistor produced in Example 4 and Comparative Example 1 under the stress conditions of Vgs=+10 V and Vds=0 V. Table 3 presents the values of ΔVth with respect to the stress time of 100 hours in the BTS test performed on each of the field-effect transistors of Examples 1 to 7 and Comparative Example 1. Here, "ΔVth" denotes a change of Vth from 0 hours of the stress time through a certain stress time.

Also, "e" in the vertical axis in the graph of FIG. 11 and in the horizontal axis in the graph of FIG. 12 denotes "the exponent of 10." For example, "1e-3" denotes "$1.0 \times 10^{-3}$" and "0.001" and "1e+05" denotes "$1.0 \times 10^{+5}$" and "100,000."

It is found from FIG. 12 and Table 3 that the field-effect transistor produced in Example 4 had a small shift in ΔVth and exhibited excellent reliability in the BTS test. Similarly, it is found from Table 3 that each of the field-effect transistors produced in Examples 1 to 3 and 5 to 7 had a small shift in ΔVth and exhibited excellent reliability in the BTS test.

Meanwhile, it is found from FIG. 12 and Table 3 that the field-effect transistor produced in Comparative Example 1 had a large shift in ΔVth and exhibited insufficient reliability in the BTS test.

TABLE 3

| | After application of stress for 100 hours | | | |
|---|---|---|---|---|
| | Stress conditions Vgs = +10 V Vds = 0 V ΔVth [V] | Stress conditions Vgs = +10 V Vds = +10 V ΔVth [V] | Stress conditions Vgs = –10 V Vds = 0 V ΔVth [V] | Stress conditions Vgs = –10 V Vds = +10 V ΔVth [V] |
| Ex. 1 | 1.52 | 1.42 | –0.77 | –0.63 |
| Ex. 2 | 1.88 | 1.88 | –0.82 | –0.56 |
| Ex. 3 | 1.23 | 1.46 | –0.63 | –0.82 |
| Ex. 4 | 1.47 | 1.63 | –0.73 | –0.71 |
| Ex. 5 | 1.62 | 1.21 | –0.81 | –0.51 |
| Ex. 6 | 1.81 | 1.56 | –0.66 | –0.68 |
| Ex. 7 | 1.40 | 1.39 | –0.90 | –0.52 |
| Comp. Ex. 1 | –10.50 | –13.22 | –13.22 | –14.52 |

Aspects of the present disclosure are, for example, as follows.

<1> A field-effect transistor including:
a substrate;
a passivation layer;
a gate insulating layer, which is formed between the substrate and the passivation layer;
a source electrode and a drain electrode, which are formed to be in contact with the gate insulating layer;
a semiconductor layer, which is formed at least between the source electrode and the drain electrode and is in contact with the gate insulating layer, the source electrode, and the drain electrode; and
a gate electrode, which is in contact with the gate insulating layer and faces the semiconductor layer via the gate insulating layer,
wherein the passivation layer is formed of a single layer containing a paraelectric amorphous oxide containing a Group A element which is an alkaline earth metal and a Group B element which is at least one selected from the group consisting of Ga, Sc, Y, and lanthanoid, and
wherein the gate insulating layer contains at least one selected from the group consisting of oxides of Si, nitrides of Si, and oxynitrides of Si.
<2> The field-effect transistor according to <1>,
wherein the paraelectric amorphous oxide contains at least one selected from the group consisting of Al, Ti, Zr, Hf, Nb, and Ta.

<3> The field-effect transistor according to <1> or <2>, wherein the semiconductor layer contains an oxide semiconductor.

<4> A display element including:
a light control element configured to control light output according to a driving signal; and
a driving circuit containing the field-effect transistor according to any one of <1> to <3> and configured to drive the light control element.

<5> The display element according to <4>, wherein the light control element contains an electroluminescent element, an electrochromic element, a liquid crystal element, an electrophoretic element, or an electrowetting element.

<6> An image display device configured to display an image corresponding to image data, the image display device including:
a plurality of display elements arranged in a form of matrix, each of the plurality of display elements being the display element according to <4> or <5>;
a plurality of wired lines configured to individually apply gate voltage to the field-effect transistors in the plurality of display elements; and
a display control device configured to individually control the gate voltage of the field-effect transistors via the plurality of wired lines correspondingly to the image data.

<7> A system including:
the image display device according to <6>; and
an image-data-generating device configured to generate image data based on image information to be displayed and to output the image data to the image display device.

The field-effect transistor according to any one of <1> to <3>, the display element according to <4> or <5>, the image display device according to <6>, and the system according to <7> can solve the above existing problems and achieve the object of the present disclosure.

What is claimed is:

1. A field-effect transistor comprising:
a substrate;
a passivation layer;
a semiconductor layer; and
a gate insulating layer, which is formed between the substrate and the passivation layer;
wherein the passivation layer is formed of a single layer containing an oxide containing a Group A element which is an alkaline earth metal and a Group B element which is at least one selected from the group consisting of Ga, Sc, Y, and lanthanoid, and
wherein the gate insulating layer contains at least one selected from the group consisting of oxides of Si, nitrides of Si, and oxynitrides of Si.

2. The field-effect transistor according to claim 1, wherein the oxide contains at least one selected from the group consisting of Al, Ti, Zr, Hf, Nb, and Ta.

3. The field-effect transistor according to claim 1, wherein the semiconductor layer contains an oxide semiconductor.

4. A display element comprising:
a light control element configured to control light output according to a driving signal; and
a driving circuit containing the field-effect transistor according to claim 1 and configured to drive the light control element.

5. The display element according to claim 4, wherein the light control element contains an electroluminescent element, an electrochromic element, a liquid crystal element, an electrophoretic element, or an electrowetting element.

6. An image display device configured to display an image corresponding to image data, the image display device comprising:
a plurality of display elements arranged in a form of matrix, each of the plurality of display elements being the display element according to claim 4;
a plurality of wired lines configured to individually apply gate voltage to the field-effect transistors in the plurality of display elements; and
a display control device configured to individually control the gate voltage of the field-effect transistors via the plurality of wired lines correspondingly to the image data.

7. A system comprising:
the image display device according to claim 6; and
an image-data-generating device configured to generate image data based on image information to be displayed and to output the image data to the image display device.

8. The field-effect transistor of claim 1, wherein the semiconductor layer is formed between the substrate and the passivation layer.

9. A field-effect transistor comprising:
a substrate;
a passivation layer;
a gate insulating layer; and
a semiconductor layer, which is formed between the substrate and the passivation layer,
wherein the passivation layer is formed of a single layer containing an oxide containing a Group A element which is an alkaline earth metal and a Group B element which is at least one selected from the group consisting of Ga, Sc, Y, and lanthanoid, and
wherein the gate insulating layer contains at least one selected from the group consisting of oxides of Si, nitrides of Si, and oxynitrides of Si.

10. The field-effect transistor according to claim 9, wherein the oxide contains at least one selected from the group consisting of Al, Ti, Zr, Hf, Nb, and Ta.

11. The field-effect transistor according to claim 9, wherein the semiconductor layer contains an oxide semiconductor.

12. A display element comprising:
a light control element configured to control light output according to a driving signal; and
a driving circuit containing the field-effect transistor according to claim 9 and configured to drive the light control element.

13. The display element according to claim 12, wherein the light control element contains an electroluminescent element, an electrochromic element, a liquid crystal element, an electrophoretic element, or an electrowetting element.

14. An image display device configured to display an image corresponding to image data, the image display device comprising:
a plurality of display elements arranged in a form of matrix, each of the plurality of display elements being the display element according to claim 12;
a plurality of wired lines configured to individually apply gate voltage to the field-effect transistors in the plurality of display elements; and a display control device configured to individually control the gate voltage of the field-effect transistors via the plurality of wired lines correspondingly to the image data.

15. A system comprising:

the image display device according to claim 14; and an image-data-generating device configured to generate image data based on image information to be displayed and to output the image data to the image display device.

16. The field-effect transistor of claim 9, wherein the gate insulator is formed between the substrate and the passivation layer.

* * * * *